(12) United States Patent
Huang et al.

(10) Patent No.: US 11,721,626 B2
(45) Date of Patent: Aug. 8, 2023

(54) SEMICONDUCTOR DEVICE WITH BACKSIDE SPACER AND METHODS OF FORMING THE SAME

(71) Applicant: Taiwan Semiconductor Manufacturing Co., Ltd., Hsinchu (TW)

(72) Inventors: Po-Yu Huang, Hsinchu (TW); Chia-Hsien Yao, Hsinchu (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/694,135

(22) Filed: Mar. 14, 2022

(65) Prior Publication Data
US 2022/0199530 A1 Jun. 23, 2022

Related U.S. Application Data

(63) Continuation of application No. 16/935,368, filed on Jul. 22, 2020, now Pat. No. 11,276,643.

(51) Int. Cl.
| | |
|---|---|
| *H01L 23/528* | (2006.01) |
| *H01L 21/8234* | (2006.01) |
| *H01L 27/088* | (2006.01) |
| *H01L 29/08* | (2006.01) |
| *H01L 29/66* | (2006.01) |
| *H01L 29/78* | (2006.01) |

(52) U.S. Cl.
CPC .. *H01L 23/5286* (2013.01); *H01L 21/823418* (2013.01); *H01L 21/823431* (2013.01); *H01L 27/0886* (2013.01); *H01L 29/0847* (2013.01); *H01L 29/66795* (2013.01); *H01L 29/785* (2013.01)

(58) Field of Classification Search
CPC ......... H01L 23/5286; H01L 21/823418; H01L 21/823431; H01L 27/0886; H01L 29/0847; H01L 29/66795
USPC ....................................................... 257/288
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Dao H Nguyen
(74) *Attorney, Agent, or Firm* — Haynes and Boone, LLP

(57) ABSTRACT

Semiconductor device and the manufacturing method thereof are disclosed. An exemplary semiconductor device comprises a dielectric layer formed over a power rail; a bottom semiconductor layer formed over the dielectric layer; a backside spacer formed along a sidewall of the bottom semiconductor layer; a conductive feature contacting a sidewall of the dielectric layer and a sidewall of the backside spacer; channel semiconductor layers over the bottom semiconductor layer, wherein the channel semiconductor layers are stacked up and separated from each other; a metal gate structure wrapping each of the channel semiconductor layers; and an epitaxial source/drain (S/D) feature contacting a sidewall of each of the channel semiconductor layers, wherein the epitaxial S/D feature contacts the conductive feature, and the conductive feature contacts the power rail.

20 Claims, 21 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,211,328 B2 * | 12/2021 | Oh .................. G11C 16/24 |
| 2012/0112264 A1 | 5/2012 | Lee |
| 2018/0277442 A1 | 9/2018 | Leobandung |
| 2019/0172828 A1 * | 6/2019 | Smith ............ H01L 21/28088 |
| 2020/0395470 A1 | 12/2020 | Kim |
| 2021/0134819 A1 * | 5/2021 | Zhang ................ H10B 41/50 |
| 2021/0305381 A1 * | 9/2021 | Chiang ............ H01L 29/78696 |
| 2021/0305428 A1 * | 9/2021 | Ju .................. H01L 29/66795 |

\* cited by examiner

U.S. 11,721,626 B2

SEMICONDUCTOR DEVICE WITH BACKSIDE SPACER AND METHODS OF FORMING THE SAME

PRIORITY DATA

This application is a continuation application of U.S. patent application Ser. No. 16/935,368, filed Jul. 22, 2020, the entirety of which is incorporated by reference.

BACKGROUND

The integrated circuit (IC) industry has experienced exponential growth. Three-dimensional multi-gate devices have been introduced to improve device performance. One example of the three-dimensional multi-gate device is a fin-like field effect transistor (FinFET) device. Another example of the three-dimensional multi-gate device is a nanosheet device (also called as a nanowire device, a nanoring device, a gate-surrounding device, a gate-all-around (GAA) device, or a multi-channel bridge device). Three-dimensional multi-gate device requires narrow fin width for short channel control, which leads to smaller source/drain regions than those of planar field effect transistors (FETs). Along with the scaling down of the device size, power rails are formed on the backside of the substrate. However, the existing backside power rails still face various challenges including routing resistance, alignment margins, and/or layout flexibility. Therefore, there is a need for a structure and method for three-dimensional multi-gate device and power rails to address these concerns for enhanced circuit performance and reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
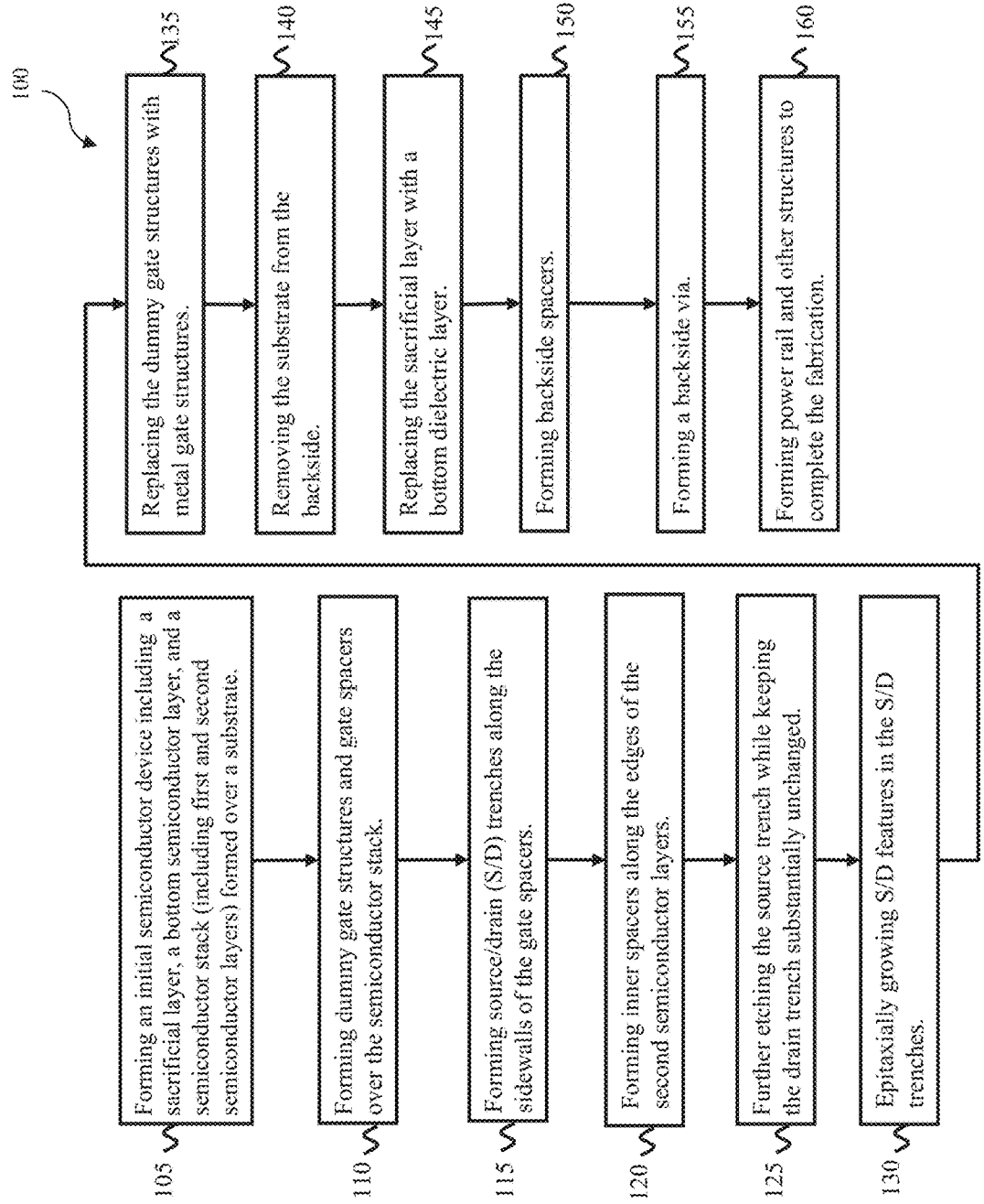
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as FinFETs or Nanosheet devices.

In a three-dimensional FET, to reduce device shrinkage and power consumption, power rails are formed on the backside of the substrate. And, the power rails are connected to the epaxial source feature through a backside via. In a conventional three-dimensional FET, to prevent the leakage between source to source or source to gate (i.e. the backside leakage), a dielectric protection layer is formed along sidewalls of the via trench. However, the protection layer may cause small metal fill window, thereby cause difficulties in backside via formation and small power rail alignment margin. The protection layer also causes high parasitic resistance, thereby degrade the performance of the semiconductor device.

In the present disclosure, instead of a dielectric protection layer, a backside spacer is used to prevent the backside leakage issue. The backside spacer is thicker than the conventional backside spacer but does not occupy the via trench space, thereby can provide better isolation than the dielectric protection layer. The sidewalls of backside via directly contacts the backside dielectric layer and the backside via. The size of backside via and the silicide layer between the backside via and the epitaxial source feature are enlarged without the protection layer. Thus, the power rail alignment margin can be enlarged, the overlay shifting issue can be mitigated, and the routing resistance can be reduced. Thereby, the performance and the reliability of the semiconductor device can be improved.

Figure 2:
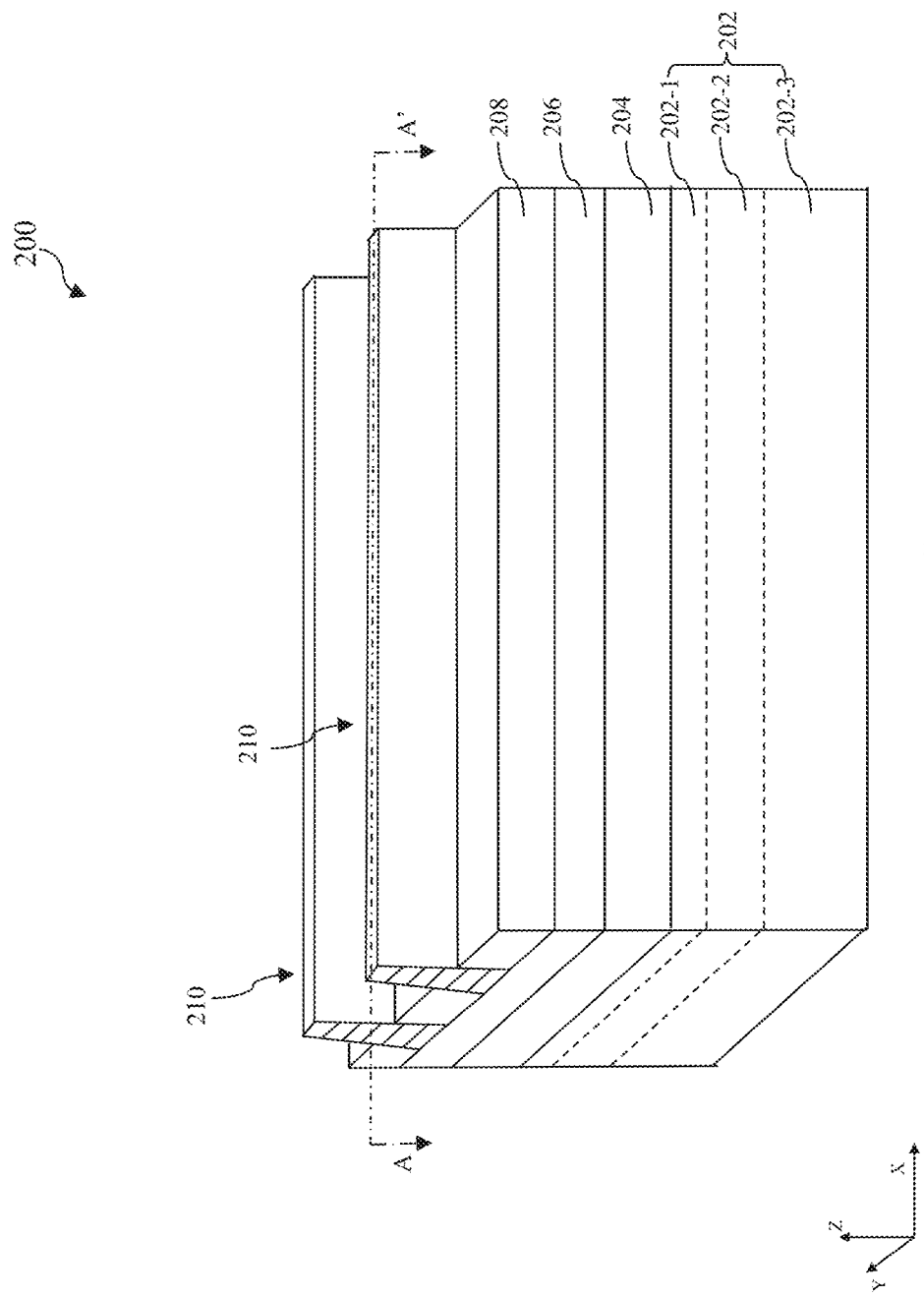
FIG. 2 illustrates a three-dimensional perspective view of the example semiconductor device at an initial stage of the method of FIG. 1 in accordance with some embodiments of the present disclosure.
Figure 12:
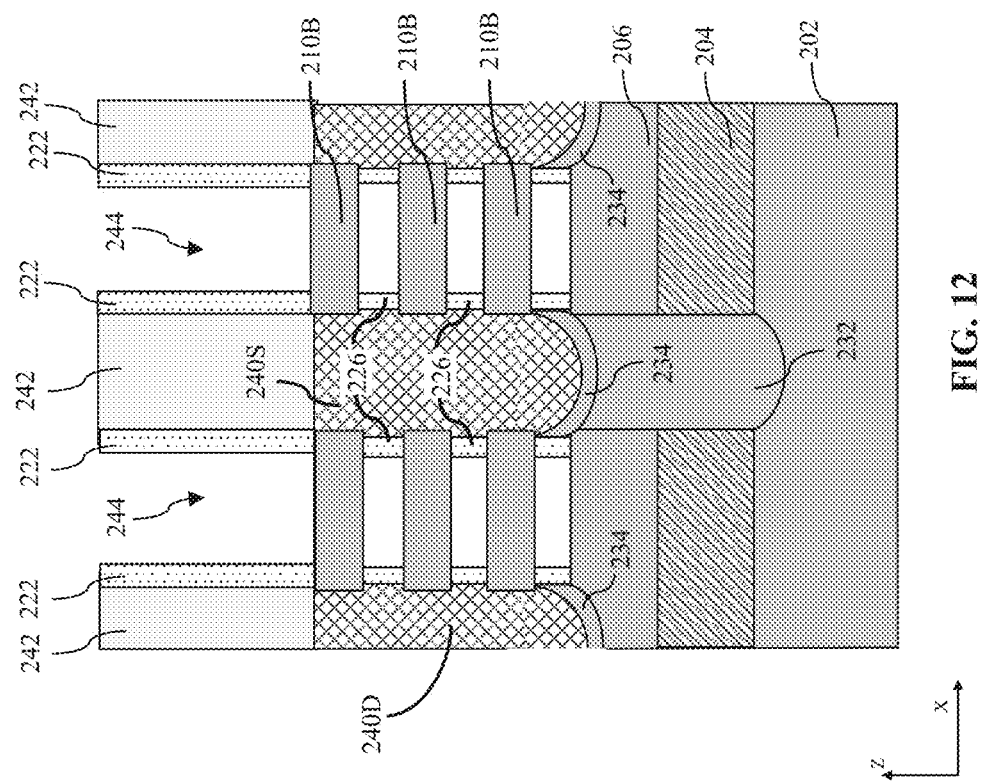
Figure 13B:
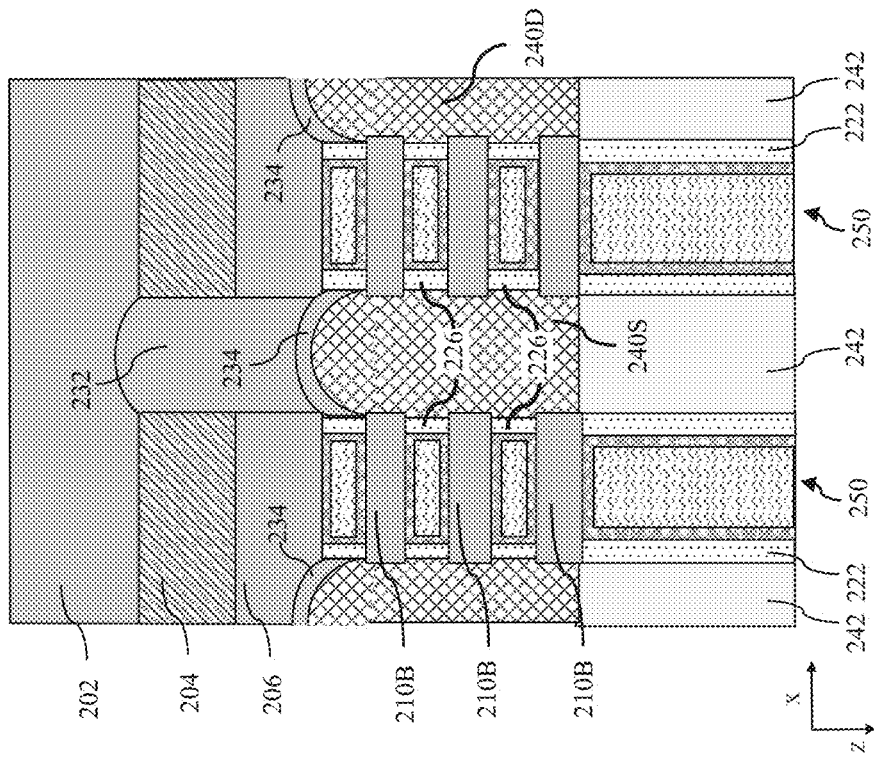
FIGS. 13B and 21B are upside-down views of FIGS. 13A and 21A, respectively.

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of the device 200 during intermediate steps of method 100. In particular, FIG. 2 illustrates a three-dimensional view of the device 200 at an initial stage of the method 100 in accordance with some embodiments of the present disclosure. FIGS. 3, 4, 5, 6, 7, 8, 9, 10, 11, 12, 13A, 14, 15, 16, 17, 18, 19, 20, 21A illustrate cross-sectional views of the device 200 taken along the plane A-A' shown in FIG. 2 (that is, in an X-Z plane) at intermediate stages of the method 100 in accordance with some embodiments of the present disclosure. And, FIGS. 13B and 21B are upside-down views of FIGS. 13A and 21A, respectively.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a nanosheet device, the present disclosure may also provide embodiments for fabricating FinFETs or planar FET devices.

Figure 3:
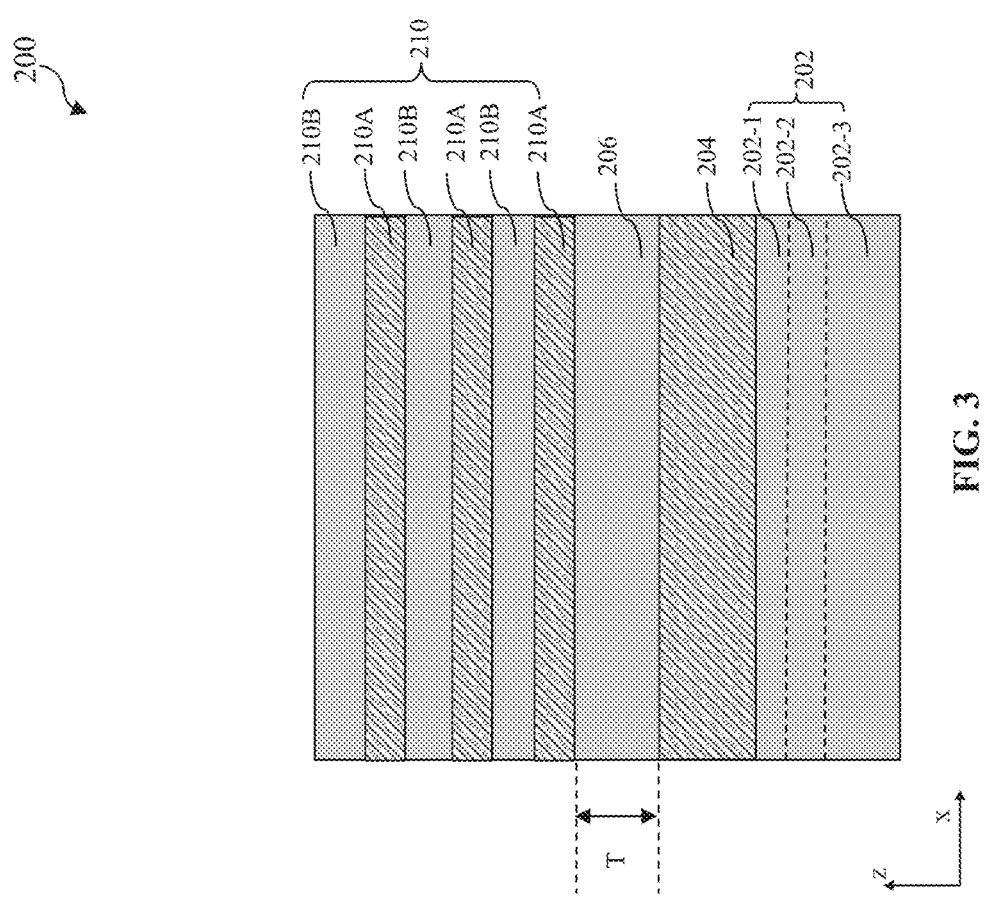
FIGS. 3, 4, 5, 6, 7, 8, 9, 10, 11, 12, 13A, 14, 15, 16, 17, 18, 19, 20, 21A illustrate cross-sectional views of the semiconductor device along line A-A' in FIG. 2 of the example semiconductor device at intermediate stages of the method of FIG. 1 in accordance with some embodiments of the present disclosure.

Referring to FIGS. 1, 2, and 3, at operation 105, an initial semiconductor structure of device 200 is formed. As depicted in FIGS. 2 and 3, the device 200 comprises a substrate 202. In some embodiments, the substrate 202 is a bulk silicon (Si) substrate. Alternatively or additionally, the substrate 202 includes another single crystalline semiconductor, such as germanium (Ge); a compound semiconductor; an alloy semiconductor; or combinations thereof. In some embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 202 is an SOI substrate. For example, the substrate 202 include silicon layers 202-1 and 202-3 and a silicon oxide (SiO) layer formed between the silicon layers 202-1 and 202-3. The SiO layer 202-2 will serve as an etch stop layer (ESL) when removing the substrate 202 before forming the power rail from the backside. Semiconductor-on-insulator substrate can be fabricated using separation by implantation of oxygen (SIMOX), wafer bonding, and/or other suitable methods. The substrate 202 may be doped with different dopants to form various doped regions therein. For example, the substrate 202 may include p-type FET (PFET) region comprising n-type doped substrate regions (such as n-well) and n-type FET (NFET) region comprising p-type doped substrate regions (such as p-well). The substrate 202 is simplified as a single layer in the following figures.

The device 200 includes alternating semiconductor layers formed over the substrate 202. For example, referring to FIGS. 2 and 3, a sacrificial layer 204 is formed over the substrate 202. In some embodiments, the sacrificial layer 204 includes a semiconductor material which is different from that of the substrate 202 and can provide a different oxidation rate and/or etching selectivity than the substrate 202 during the backside process(es). In the depicted embodiment, the sacrificial layer 204 includes silicon germanium (SiGe), while the substrate 202 includes Si. In some embodiments, the sacrificial layer 204 is epitaxially grown over the substrate 202. The epitaxy process may include chemical vapor deposition (CVD) (for example, vapor-phase epitaxy (VPE), ultra-high vacuum CVD (UHV-CVD), low-pressure CVD (LPCVD), metal organic CVD (MOCVD), and/or plasma-enhanced CVD (PECVD)), molecular beam epitaxy (MBE), other suitable selective epitaxial growth (SEG) processes, or combinations thereof.

Still referring to FIGS. 2 and 3, a bottom semiconductor layer 206 is formed over the sacrificial layer 204. The bottom semiconductor layer 206 includes a semiconductor material different from the sacrificial layer 204, such that the sacrificial layer 204 may be selectively removed before forming the backside via. In some embodiments, the bottom semiconductor layer 206 includes a material same as the substrate (for example, Si). In some embodiments, the bottom semiconductor layer 206 is also formed by an epitaxial growing process, such as CVD (for example, VPE, UHV-CVD, LPCVD, MOCVD, and/or PECVD), MBE, other suitable SEG processes, or combinations thereof. As depicted in FIG. 3, the bottom semiconductor layer 206 has a thickness T along the Z-direction. The thickness T decides the height of the backside spacers and thus cannot be too large or too small. For example, if the thickness T is too small, there may be not enough space to form a backside spacer with enough width to provide good isolate between the backside via and the bottom semiconductor layer 206; if the thickness T is too large, the metal gap fill (to form the backside via) may become much difficult and the backside via size may be enlarged, thereby cause high resistance. In some embodiments, the thickness T is about 15 nm to about 30 nm.

A semiconductor stack 210 (hereinafter, the stack 210), including alternate semiconductor layers 210A and 210B, is then formed over the bottom semiconductor layer 206. In some embodiments, the semiconductor layers 210A includes a first semiconductor material and the semiconductor layers 210B includes a second semiconductor material which is different from the first semiconductor material. The different semiconductor materials of the semiconductor layers 210A and 210B have different oxidation rates and/or different etch selectivity. In some embodiments, the second semiconductor material of the semiconductor layers 210B is the same as the substrate 202. In the depicted embodiment, the semiconductor layers 210B comprise silicon (Si, like the substrate 202), and the semiconductor layers 210A comprise silicon germanium (SiGe). Thus, alternating SiGe/Si/SiGe/Si . . . layers are arranged from bottom to top over the bottom semiconductor layer 206. In some embodiments, the material of the top semiconductor layer may or may not be the same as the bottom semiconductor layer. In some embodiments, the semiconductor layers 210B may be undoped or substantially dopant-free. (In other words, no intentional doping is performed when forming the semiconductor layers 210B.) In some other embodiments, the semiconductor layers 210B may be doped with a p-type dopant or an n-type dopant. The number of the semiconductor layers 210A and 210B depends on the design requirements of the device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the bottom semiconductor layer 206 by an epitaxial growth process, such as CVD (for example, VPE, UHV-CVD, LPCVD, MOCVD, and/or PECVD), MBE, other suitable SEG processes, or combinations thereof.

The alternating semiconductor layers 210A and 210B are then patterned to form the stacks 210. Photoresist and etching processes may be performed to the semiconductor layers 210A and 210B to form the fin-shape stacks 210 as illustrated in FIG. 2. For example, first, a patterned photoresist mask is formed over the device 200. The patterned photoresist mask covers the fin positions according to the design requirement of the device 200. Subsequently, one or more etching processes are performed using the patterned photoresist mask to form the stacks 210. The etching process includes dry etching, wet etching, other suitable etching process, or combinations thereof. And, the photoresist mask is then removed by any proper method (such as an ashing process). In the depicted embodiment, the one or more etching processes remove, along the patterned photoresist mask, the semiconductor layers 210A, 210B to form the fin-shape stacks 210. Trenches are formed between the stacks 210.

Thereafter, still referring to FIG. 2, an isolation structure 208 is formed in the trenches between the stacks 210 to separate and isolate the active regions of the device 200. In some embodiments, one or more dielectric materials, such as silicon dioxide (SiO) and/or silicon nitride (SiN), is deposited over the bottom semiconductor layer 206 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 208. In some embodiments, a top surface of the isolation structure 208 is substantially coplanar with or below a bottom surface of the lowermost semiconductor layer of the stacks 210.

Figure 4:
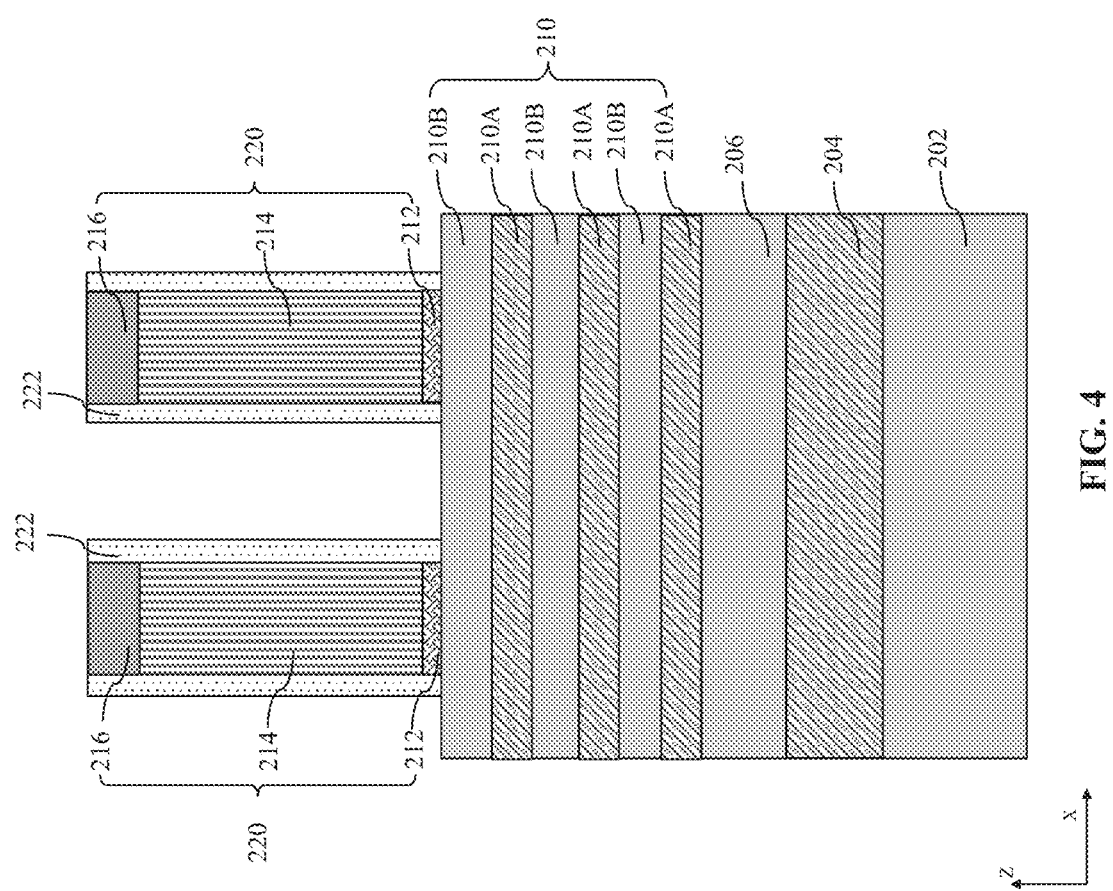

Now, referring to FIGS. 1 and 4, at operation 110, dummy gate structures 220 are formed over the stacks 210. Each dummy gate structure 220 serves as a placeholder for subsequently forming a metal gate structure. The dummy gate structures 220 extend along the Y-direction and traverse respective stacks 210. The dummy gate structures 220 cover the channel regions of the stacks 210 which interpose the source regions and the drain regions (both referred to as source/drain (S/D) regions). Each of the dummy gate structures 220 may include various dummy layers. In the depicted embodiment, the dummy gate structure 220 includes an interfacial layer 212 (for example, including SiO) disposed over the stack 210 and the substrate 202, a dummy gate electrode 214 (for example, including polysilicon) disposed over the interfacial layer 212, and one or more hard mask layers 216 (for example, including a dielectric material such as SiN, silicon carbonitride (SiCN), SiO, etc.) over the dummy gate electrode 214. In some embodiments, the dummy gate structure 220 may also include other suitable layers. The dummy gate structures 220 are formed by deposition processes, lithography processes, etching processes, other suitable processes, or combinations thereof. For example, different dummy layers are deposited over the stacks 210. A lithography process is then performed to form a mask covering the channel regions of the stack 210. Thereafter, the different dummy layers are etched using the lithography mask to form the dummy gate structures 220. And, the lithography mask is then removed using any proper method (such as an ashing process).

Still referring to FIGS. 1 and 4, gate spacers 222 are formed along the sidewalls of the dummy gate structures 220 over the stack 210. In some embodiments, the gate spacers 222 comprise a dielectric material, such as SiO, SiN, silicon oxynitride (SiON), silicon carbide (SiC), other dielectric material, or a combination thereof. The gate spacers 222 are formed by any suitable process(es). For example, first, a spacer layer comprising the dielectric material is deposited (for example, by atomic layer deposition (ALD), CVD, PVD, or other proper process) over the isolation structure 208 and along sidewalls and over top surfaces of the dummy gate structures 220 and the stacks 210. Subsequently, the spacer layer is anisotropically etched to remove the portions in the X-Y plane (the plane in which the top surface of the substrate 202 is). The remaining portions of the spacer layer then become the gate spacers 222.

Figure 5:
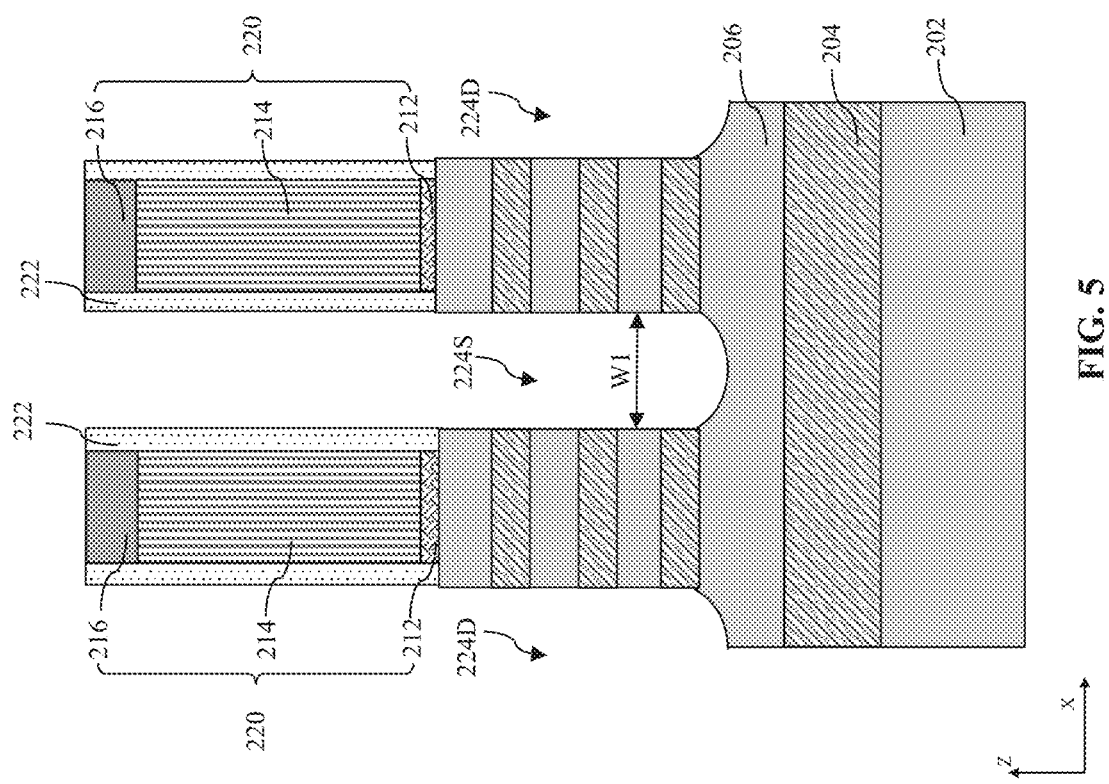

Now referring to FIGS. 1 and 5, at operation 115, source/drain (S/D) trenches 224 are formed over the S/D regions of the stack 210. Referring to FIG. 5, the S/D regions of the stack 210 are recessed along the sidewalls of the gate spacers 222 to form the S/D trenches 224S and 224D (all referred to as S/D trenches 224). In the depicted embodiment, the source trench 224S is formed over the source region of the stack 210; and the drain trenches 224D are formed over the drain regions of the stack 210. The S/D regions of the stack 210 are recessed by a S/D etching process performed along the gate spacers 222. The S/D etching process may be a dry etch (such as a reactive ion etching (ME) process), a wet etch, or combinations thereof. The duration of the S/D etching process is controlled such that the sidewalls of each semiconductor layers 210A and 210B are exposed in the S/D trenches. Referring to FIG. 5, the source trench 224S has a width W1 along the X-direction. The width W1 depends on the design requirement of the device 200. In some embodiments, the width W1 is about 20 nm to about 40 nm.

Figure 6:
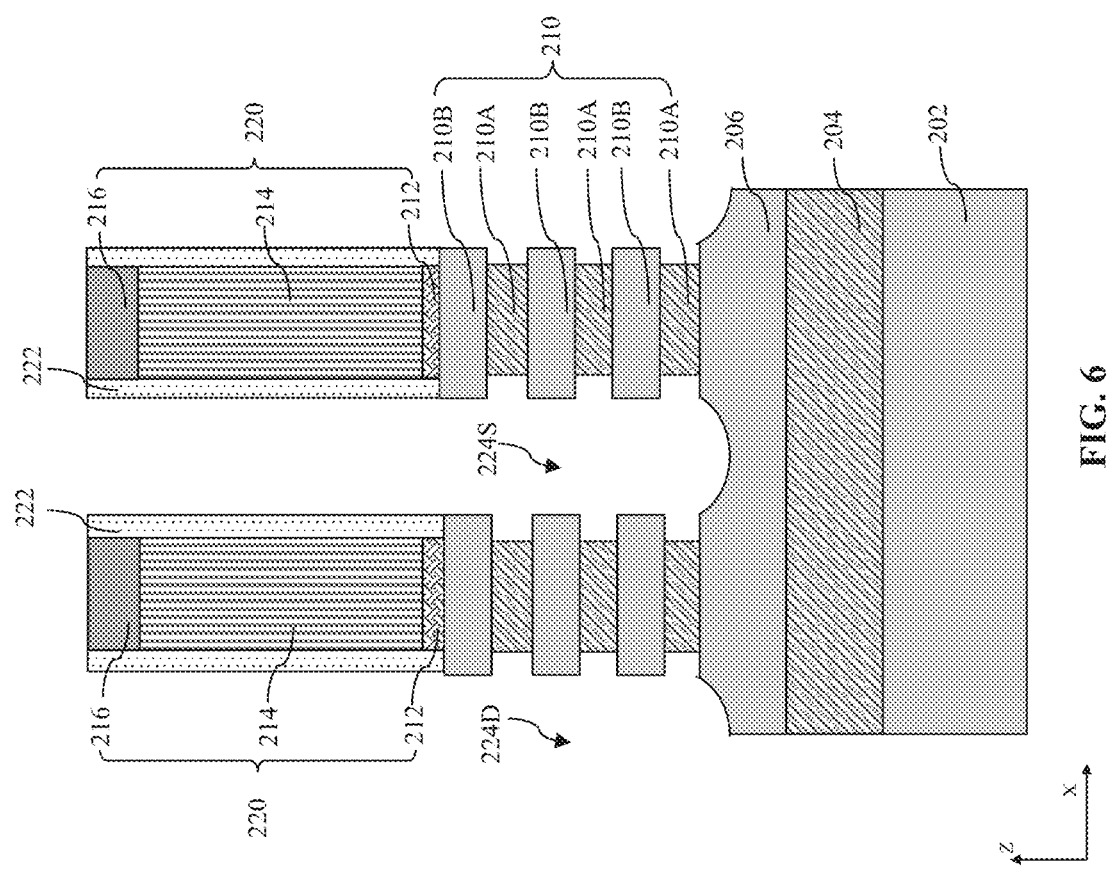
Figure 7:
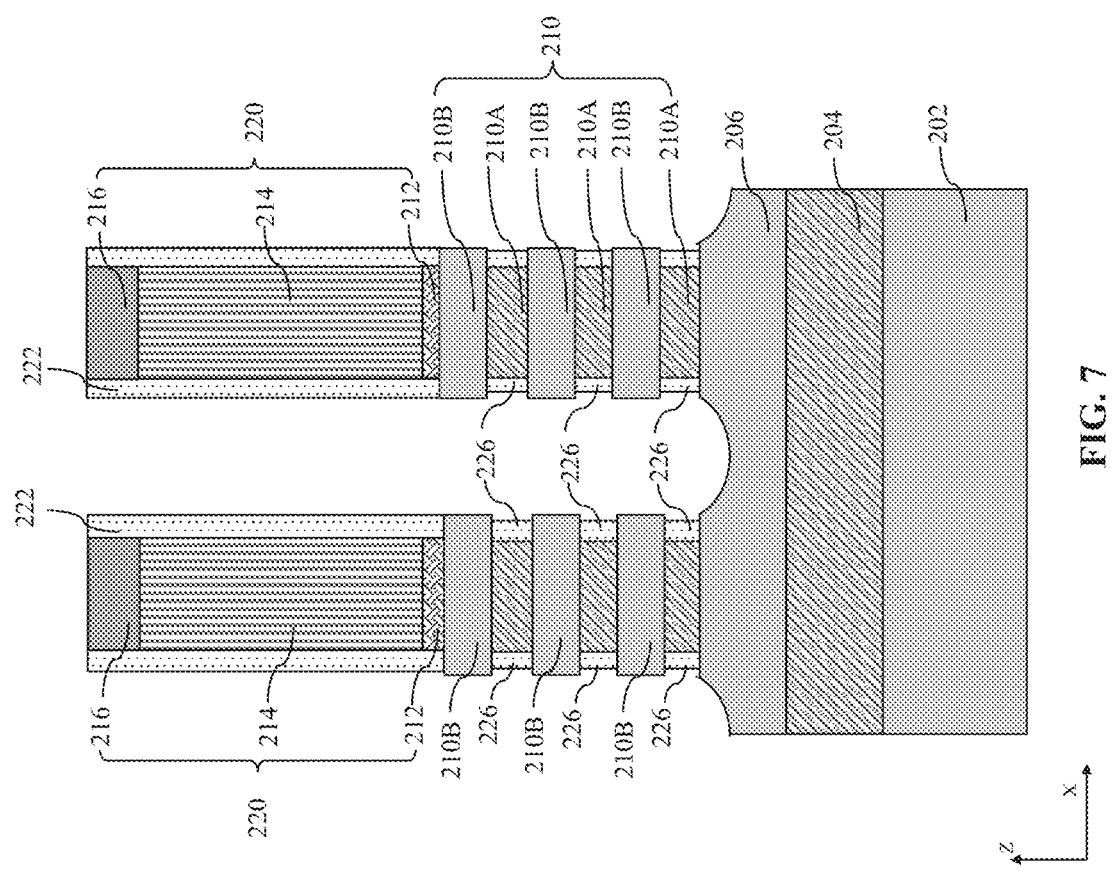

Now referring to FIGS. 1, 6, and 7, at operation 120, inner spacers 226 are formed between the edges of the semiconductor layers 210B. Referring to FIG. 6, the exposed portions (edges) of the semiconductor layers 210A in the S/D trenches 224 are selectively removed by a suitable etching process to form gaps between the semiconductor layers 210B. In other words, edges of the semiconductor layers 210B are suspended in the S/D trenches 224. Due to the different oxidation rates and/or etching selectivities of the materials of the semiconductor layers 210A (for example, SiGe) and 210B (for example, Si), only exposed portions (edges) of the semiconductor layers 210A are removed, while the semiconductor layers 210B remain substantially unchanged. In some embodiments, the selective removal of the exposed portions of the semiconductor layers 210A may include an oxidation process followed by a selective etching process. For example, the edge portions of the semiconductor layers 210A are first selectively oxidized to include a material of SiGeO. Then, a selective etching process is performed to remove the SiGeO with a suitable etchant such as ammonium hydroxide (NH$_4$OH) or hydro fluoride (HF). The duration of the oxidation process and the selective etching process can be controlled such that only edge portions of the semiconductor layers 210A are selectively removed.

Thereafter, referring to FIG. 7, inner spacers 226 are formed to fill in the gaps between the semiconductor layers 210B. The inner spacers 226 comprise a dielectric material such as SiO, SiN, SiON, SiC, or combinations thereof. The dielectric material of the inner spacers may be deposited in the S/D trenches 224 and in the gaps between the edges of the semiconductor layers 210B by ALD, CVD, PVD, or combinations thereof. Extra dielectric material is then removed along sidewalls of the gate spacers 222 until the sidewalls of the semiconductor layers 210B are exposed in the S/D trenches 224.

Figure 8:
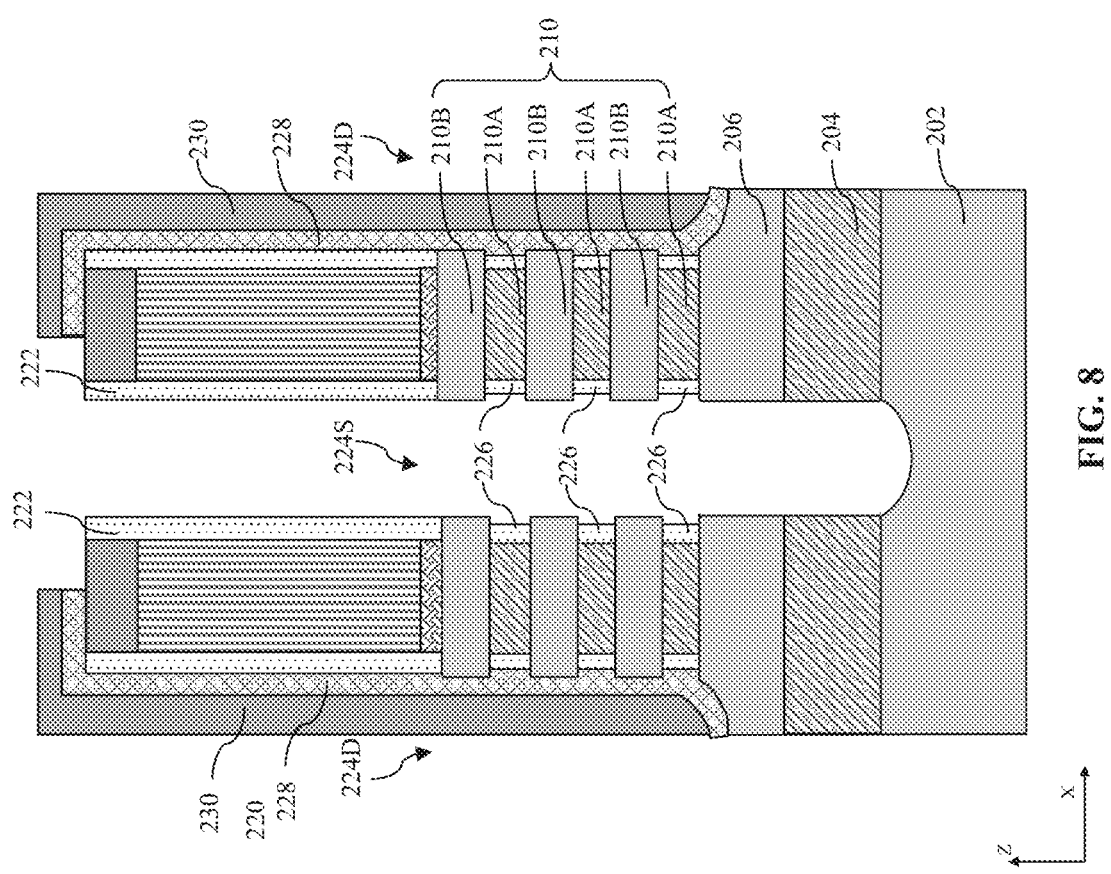

Now referring to FIGS. 1 and 8, at operation 125, the source trench 224S between the dummy gate structures 220 is further recessed, while the drain trenches 224D are substantially unchanged. In some embodiments, the recessing process involves lithography and etching processes. For example, first, a photoresist layer is deposited over the substrate. The photoresist layer is then exposed to a pattern layer 230 which exposes the source region 224S and covers the drain regions 224D. Thereafter, a post-exposure bake process is performed to develop the photoresist layer to form a mask layer 228 exposing the source trench 224S between the dummy gate structures 220 and covering the drain trenches 224D. Referring to FIG. 8, a further S/D etching process is performed, using the patterned mask layer 228 as a mask, such that the source trench 224S is further recessed while the drain trenches 224D remain substantially unchanged. Referring to FIG. 8, a bottom surface of the source trench 224S is below a bottom surface of the sacrificial layer 204, while a bottom surface of the drain trenches 224D is above a top surface of the sacrificial layer 204. In other words, the sacrificial layer 204 and the bottom semiconductor layer 206 are separated in the source region between the dummy gate structures 220, and sidewalls of the sacrificial layer 204 and the bottom semiconductor layer 206 are exposed in the recessed source trench 224S. The pattern layer 230 may be removed before or after the recession of the source trench 224S.

Figure 9:
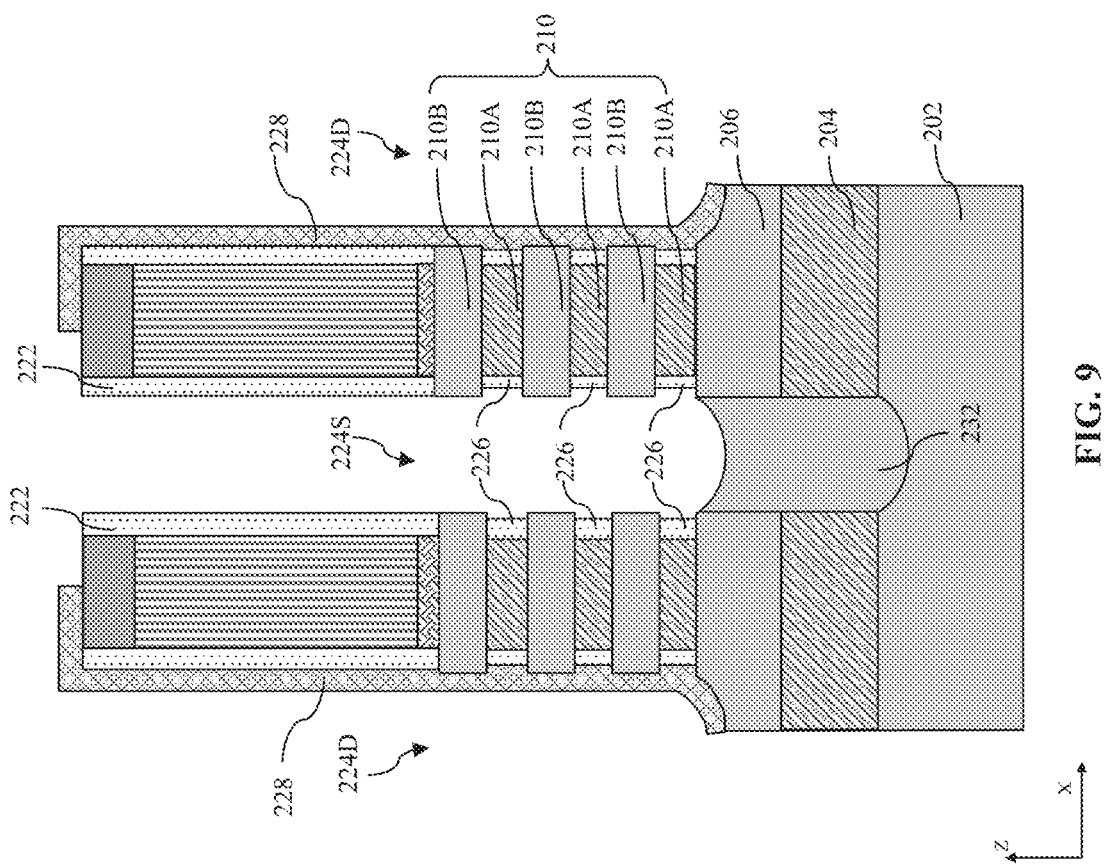
Figure 10:
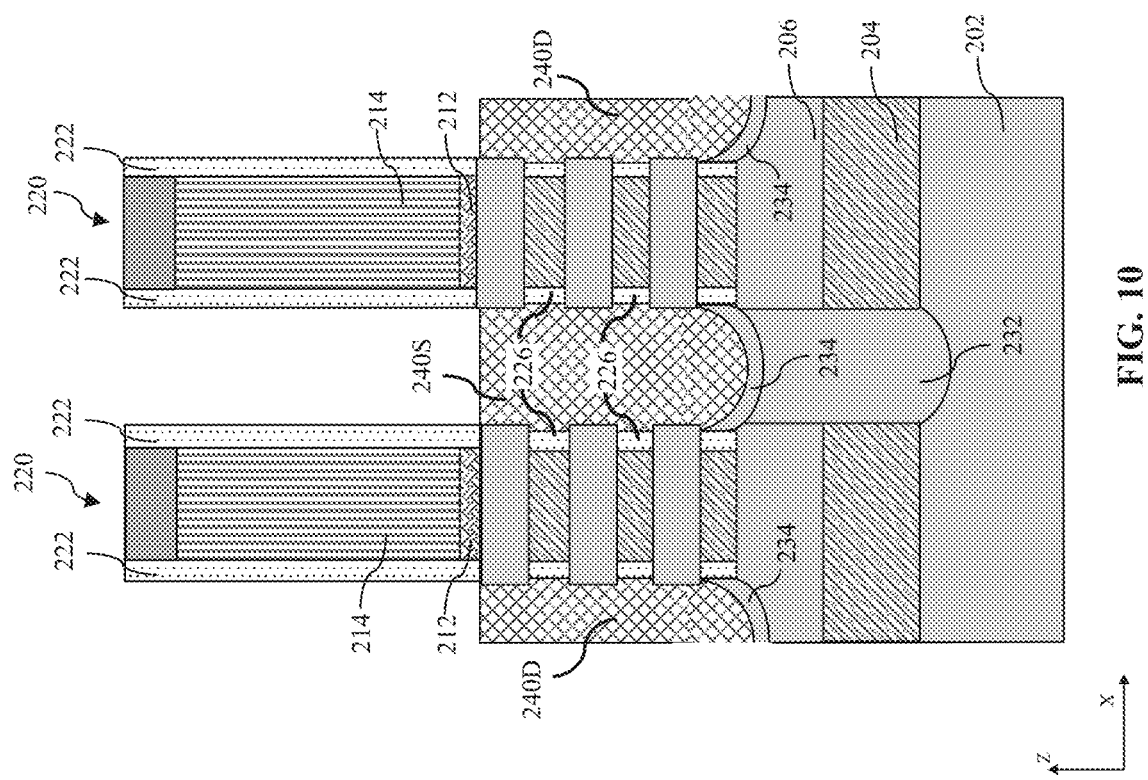

Now referring to FIGS. 1, 9 and 10, at operation 130, epitaxial S/D features 240 are formed in the S/D trenches 224. Referring to FIG. 9, first, a semiconductor feature 232 is epitaxially grown from the substrate 202, the sacrificial layer 204, and the bottom semiconductor layer 206 in the source trench 224S. The semiconductor feature 232 includes a material providing different oxidation rates and/or etching selectivities than the material of the sacrificial layer 204. For example, the semiconductor feature 232 includes Si, while the sacrificial layer 204 includes SiGe. The epitaxy process may comprise CVD (for example, VPE, UHV-CVD, LPCVD, MOCVD, and/or PECVD), MBE, other suitable SEG processes, or combinations thereof. The mask layer 228 is then removed after the formation of the semiconductor feature 232.

Thereafter, referring to FIG. 10, the epitaxial source feature 240S and the epitaxial drain feature 240D (both referred to as the epitaxial S/D features 240) are epitaxially grown in the source trench 224S and the drain trench 224D, respectively. In some embodiments, each of the epitaxial S/D features 240 comprises a semiconductor material such as Si or Ge; a compound semiconductor such as SiGe, SiC, gallium arsenide (GaAs), etc.; an alloy semiconductor; or combinations thereof. In some embodiments, before epitaxially growing the S/D features 240, undoped silicon layers 234 are epitaxially grown in the S/D trenches 224 to improve the epitaxial grown surface of the S/D features 240. In some embodiments, the silicon layer 234 is considered as a portion of the S/D feature 240. An epitaxy process may be implemented to epitaxially grow the silicon layers 234 and/or the S/D features 240. The epitaxy process may comprise CVD deposition (for example, VPE, UHV-CVD, LPCVD, MOCVD, and/or PECVD), MBE, other suitable SEG processes, or combinations thereof. The epitaxial S/D features 240 may be doped with n-type dopants and/or p-type dopants. In some embodiments, the epitaxial S/D features 240 may comprise multiple epitaxial semiconductor layers, and different epitaxial semiconductor layers are different in amount of dopant comprised therein.

Now referring to FIGS. 1, 11, 12, 13A and 13B, at operation 135, a metal gate replacement process is performed to replace the dummy gate structures 220 with metal gate structures 250. The metal gate replacement process includes various processing steps. For example, referring to FIG. 11, an interlayer dielectric (ILD) layer 242 is formed over the substrate 202. The ILD layer 242 is disposed along the gate spacers 222 and over the isolation structure 208 and the epitaxial S/D features 240. In some embodiments, the ILD layer 242 comprises a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 242 may be formed by deposition processes such as CVD, flowable CVD (FCVD), spin-on-glass (SOG), other suitable methods, or combinations thereof. In some embodiments, a planarizing process is performed to remove the excess ILD material over the dummy gate structure and a top portion of the dummy gate structure to expose the dummy gate electrode.

Figure 11:
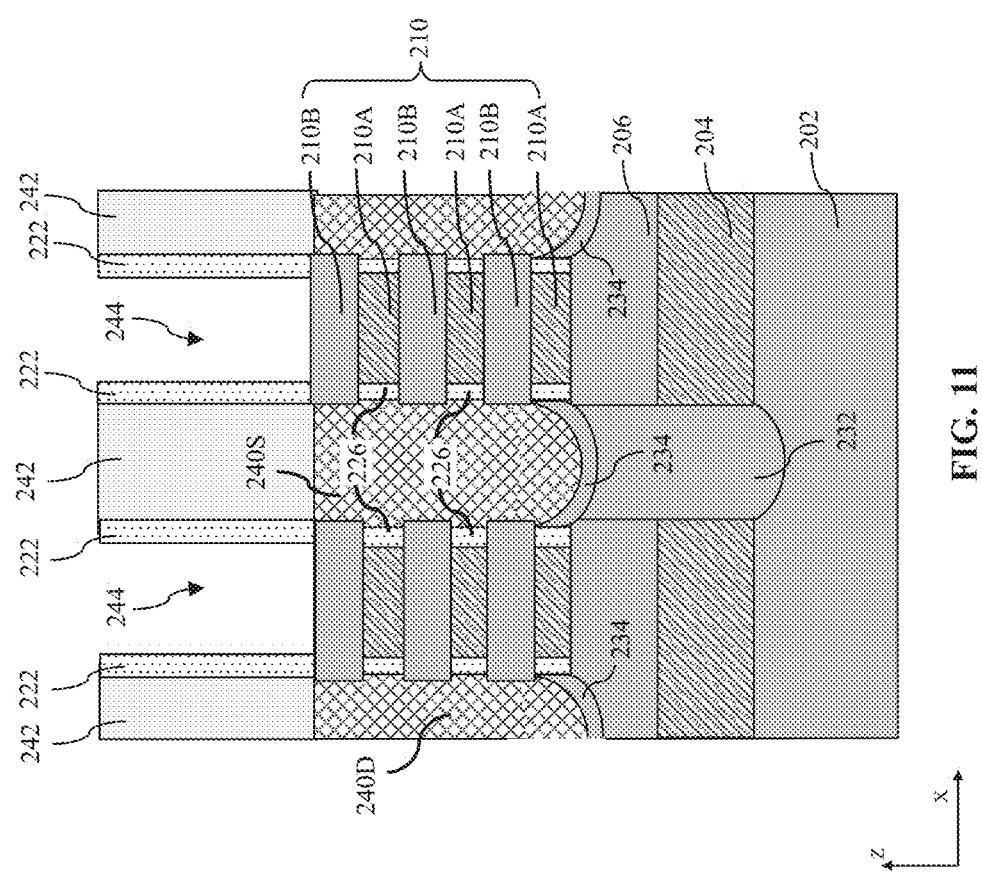

Still referring to FIG. 11, the remained portions of the dummy gate structures 220 are removed to form gate trenches 244 exposing the channel regions of the stacks 210. In some embodiments, removing the dummy gate structures 220 comprises one or more etching processes, such as wet etching, dry etching (e.g. reactive-ion etching (RIE)), or other etching techniques. The semiconductor layers 210A and 210B are then exposed in the gate trenches 244.

Subsequently, referring to FIG. 12, the semiconductor layers 210A are selectively removed from the gate trenches 244. Due to the different materials of the semiconductor layers 210A and 210B, the semiconductor layers 210A are removed by a selective oxidation/etching process similar as those to remove the edge portions of the semiconductor layers 210A. In some embodiments, the semiconductor layers 210B are slightly etched or not etched during the operation 135. Thereby, the semiconductor layers 210B are suspended in the channel region of the stacks 210 and stacked up along a direction (i.e. the Z-direction) substantially perpendicular to a top surface of the substrate 202 (i.e. the X-Y plane). The suspended semiconductor layers 210B are also referred to as channel semiconductor layers 210B.

Figure 13A:
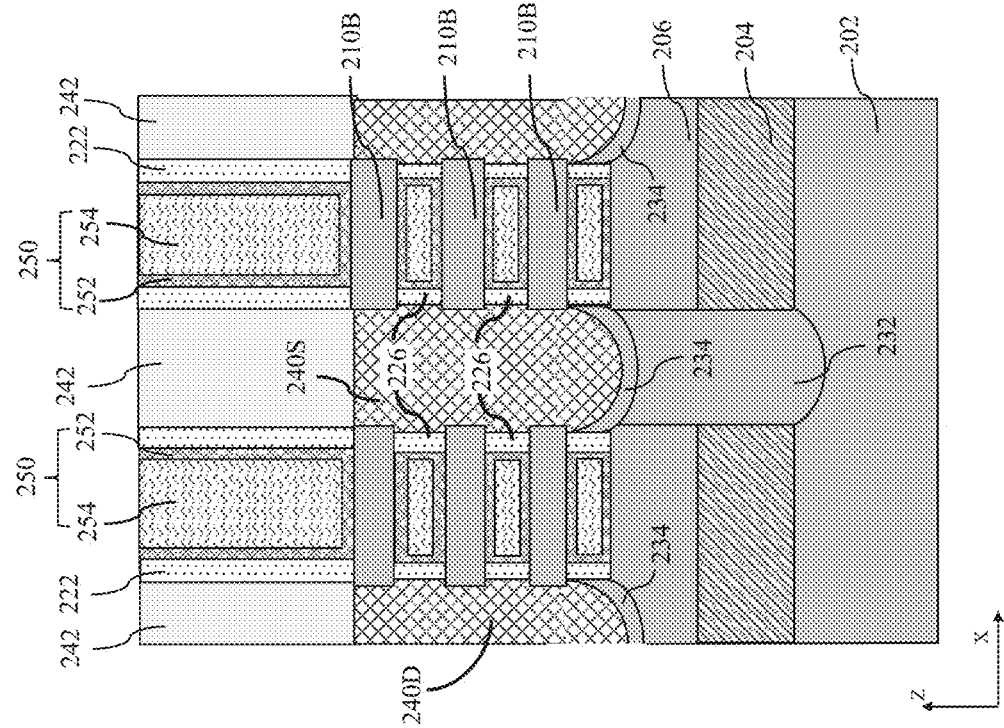

Then, referring to FIG. 13A, metal gate structures 250 are formed in the channel regions of the stacks 210. The metal gate structures 250 wrap each of the suspended channel semiconductor layers 210B. In some embodiments, each metal gate structure 250 includes a gate dielectric layer 252, a metal gate electrode 254, and/or other metal gate layers. In some embodiments, the gate dielectric layer 252 includes a high-k (K>3.9) dielectric material, such as HfO$_2$, HfSiO, HfSiO$_4$, HfSiON, HfLaO, HfTaO, HfTiO, HfZrO, HfAlOx, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), Si$_3$N$_4$, hafnium dioxide-alumina (HfO$_2$—Al$_2$O$_3$) alloy, other suitable high-k dielectric material, or combinations thereof. In some embodiments, the gate dielectric layer 252 is deposited by CVD, PVD, ALD, and/or other suitable method. The metal gate electrode 254 is then filled in the spaces between the gate dielectric layer 252. Each metal gate electrode 254 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode 254 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the device 200.

Subsequently, various interconnection structures (not shown) are formed over the top (i.e. the frontside) of the device 200. In some embodiments, the various interconnection structures may include dielectric ILD layers, conductive S/D contacts, vias, metal lines, and/or other structures, configured to connect the various features to form a functional circuit that may include one or more multi-gate devices. Thereafter, for the convenience of processing and description, the device 200 is turned upside-down for backside power rail fabrication. FIG. 13B is merely an upside-down view of FIG. 13A, where the device 200 in an upside-down X-Z plane (i.e. the frontside is down, and the backside is up). And, the following FIGS. 14-20 and 21A are the cross-section views of the device 200 in the upside-down X-Z plane.

Figure 14:
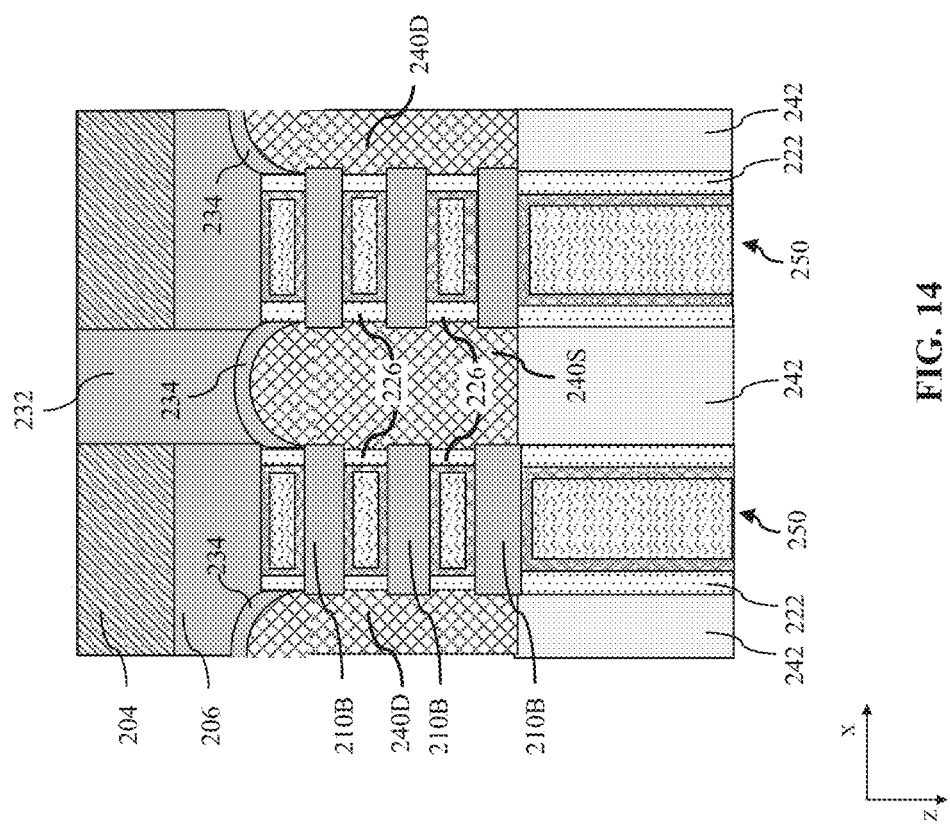

Now referring to FIGS. 1 and 14, at operation 140, the substrate 202 is removed from the bottom (i.e. the backside) of the device 200, such that the semiconductor feature 232 and the scarification layer 204 are exposed. In some embodiments, the removal of the substrate 202 includes various processes, such as etching process (for example, wet etching, dry etching, other etching process, or a combination thereof) and planarization process (for example, CMP or other suitable planarization process).

Figure 15:
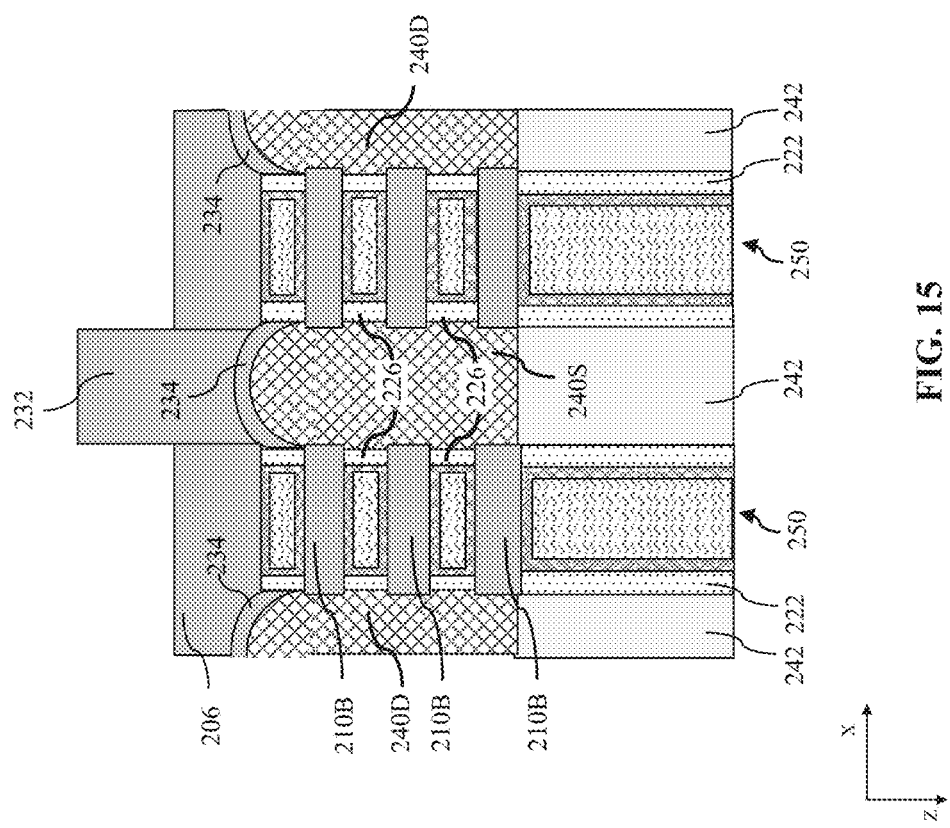
Figure 16:
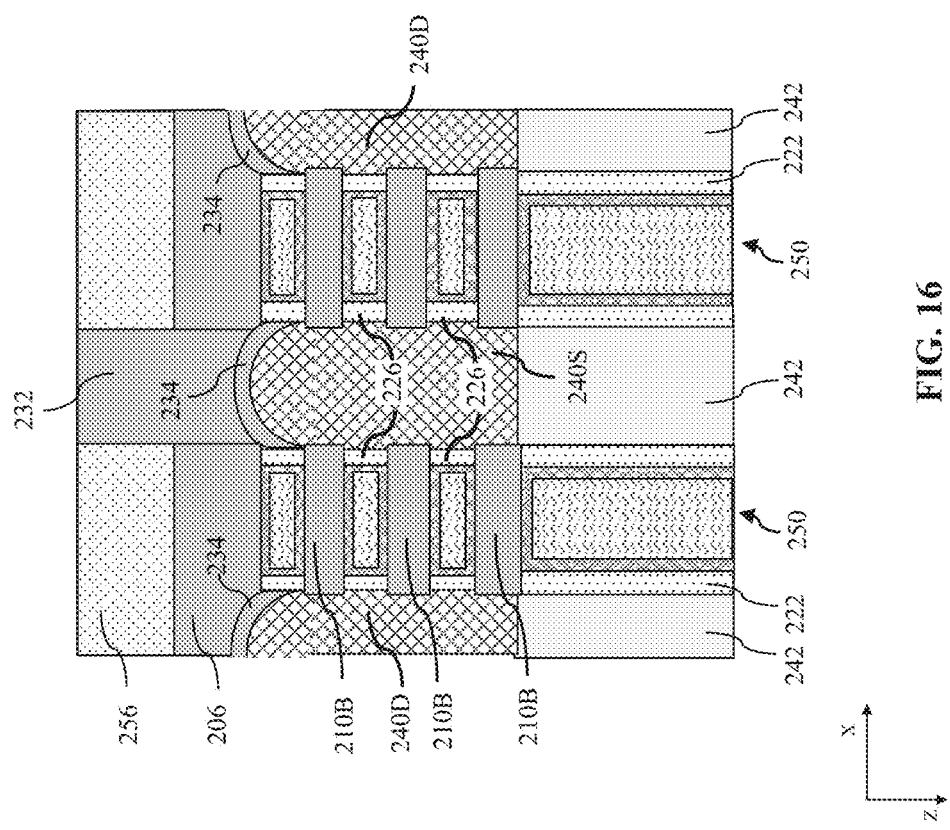

Thereafter, referring to FIGS. 1, 15, and 16, at operation 145, the sacrificial layer 204 is replaced by a bottom dielectric layer 256. Referring to FIG. 15, since the sacrificial layer 204 includes a material (for example, SiGe) having a different selectivity than the material of the bottom semiconductor layer 206 and the semiconductor feature 232 (for example, Si), the sacrificial layer 204 can be selectively removed by a selective etching process. The selective etching process is similar as the aforementioned selective oxidation/etching process to remove the semiconductor layers 210A. Then, referring to FIG. 16, a bottom dielectric layer 256 is formed in the place of the sacrificial layer 204. In some embodiments, the bottom dielectric layer 256 includes a dielectric layer such as SiO, SiON, SiN, SiOCN, SiCN, SiOC, other dielectric material, or a combination thereof. The dielectric material of the bottom dielectric layer 256 may be deposited (for example, by ALD, CVD, other proper deposition process, or a combination thereof) over the backside of the bottom semiconductor layer 206 and the semiconductor feature 232. Thereafter, a planarizing process (such as a CMP) is performed to remove the excess dielectric material to expose the semiconductor feature 232. The remained dielectric material forms the bottom dielectric layer 256.

Figure 17:
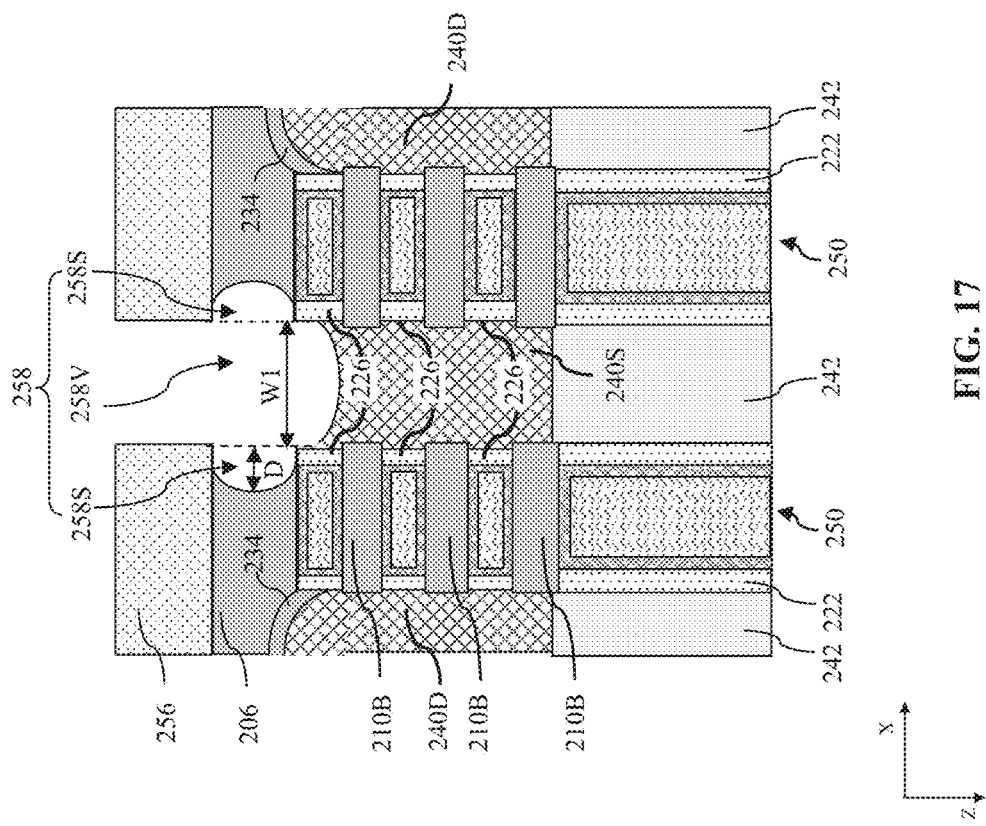
Figure 18:
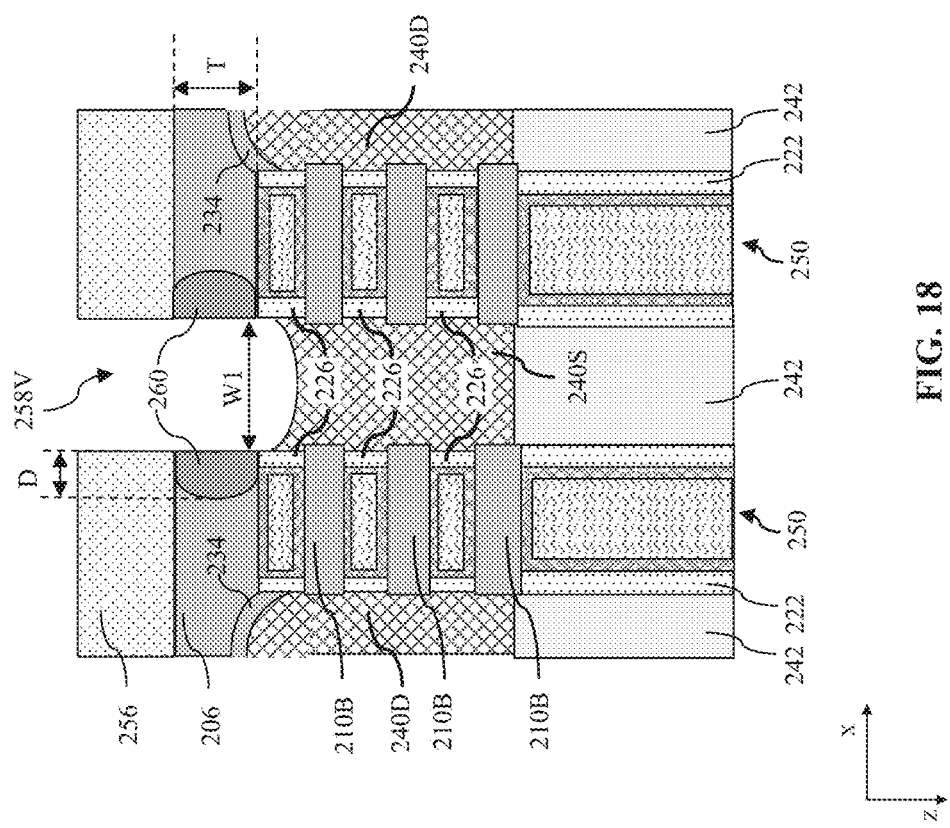

Now referring to FIGS. 1, 17, and 18, at operation 150, backside spacers 260 are formed. Referring to FIG. 17, the semiconductor feature 232 and the portions of the bottom semiconductor layer 206 contacting the semiconductor feature 232 (i.e. the side portions of the bottom semiconductor layer 206) are selectively removed to form a backside trench 258. In some embodiments, the silicon layer 234 in the source trench and a bottom portion of the epitaxial source feature 240S are also removed at operation 150, such that a bottom surface of the backside trench 258 is below a bottom surface of the bottom semiconductor layer 206 in the upside-down direction. In other words, the bottom semiconductor layer 206 is punched through by the backside trench 258 and are laterally etched at operation 150. The backside trench 258 exposes the sidewalls of the backside dielectric layer 256 and the bottom semiconductor layer 206 and a portion of the inner spacers 226. And, a distance between the sidewalls of the bottom semiconductor layer 206 exposed in the backside trench 258 is greater than a distance of the sidewalls of the bottom dielectric layer 256 exposed in the backside trench 258 for an extent D along each side. In the depicted embodiment, the backside trench 258 includes a main portion 258V for backside via formation (also referred to as a via trench 258V) along the sidewalls of the bottom dielectric layer 256 extending to a bottom surface of the epitaxial source feature 240S and side portions 258S along the laterally recessed side portions of bottom semiconductor layer 206. In some embodiments, the backside trench 258 is formed by a one-step isotropic selective etching process. In some other embodiments, the backside trench 258 is formed by an anisotropic selective etching process followed by an isotropic selective etching process. In some embodiments, the selective etching solution may include potassium hydroxide (KOH), tetramethylammonium hydroxide (TMAH), other alkaline solution, or a combination thereof. In the depicted embodiment, the bottom semiconductor layer 206 includes Si, the isotropic etching may be a selective dry etching using ammonium hydroxide (NH$_4$OH) of a concentration about 1:5 to about 1:30, at a temperature of about 50° C. to about 70° C., for a duration of about 120 seconds to about 300 seconds. The duration of the selective etching process controls the width D of the side portions 258S of the backside trench.

Thereafter, referring to FIG. 18, the backside spacers 260 are formed in the side portions 258S of the backside trench. Thereby, only the via trench 258V is open from the backside of the device 200. In some embodiments, a material of the backside spacers 260 can provide different oxidation rate and/or etching selectivity than the material of the bottom dielectric layer 256. For example, the backside spacers 260 include a material such as SiO, SiON, SiN, SiOCN, SiCN, SiOC. In some embodiments, the backside spacers 260 are formed by ALD or other suitable deposition process in the side portions 258S of the backside trench. Referring to FIG. 18, the backside spacers 260 contact the sidewalls of the recessed bottom semiconductor layer 206, a bottom surface of the bottom dielectric layer 256, and a top surface of the inner spacer 226 in an upside-down direction. Therefore, the sidewalls of the bottom dielectric layer 256, the backside spacers 260 and the inner spacers 226 form the sidewalls of the via trench 258. The sidewalls of the via trench 258V includes only dielectric materials after the formation of the backside spacers 260. Each of the backside spacer 260 has a width D along the X-direction and a height T along the Z-direction. And, a distance between the sidewall spacers 260 along the X-direction is W1 (i.e. the width of the via trench 258V). The width D is controlled such that it is thick enough (thicker than a conventional dielectric protection layer) to provide good isolation between the later formed backside via and the backside semiconductor layer. The width D is also controlled to be not too thick to avoid the void formation during the deposition process when forming the sidewall spacers 260. The height T of the backside spacers 260 is decided by the thickness of the bottom semiconductor layer 206. As mentioned before, T cannot be too large for the consideration of the metal gap filling process and the resistance caused by the backside via and T cannot be too small so that it can provide enough space to form the backside spacers 260. In some embodiments, the width D is about 20% to about 25% of the width W1 of the via trench 258V; the height T is about 60% to about 80% of the width W1; and the width D is about 25% to about 35% of the height T. In some further embodiments, the width D is about 4 nm to about 10 nm; the height T is about 15 nm to about 30 nm, and the distance W1 is about 20 nm to about 40 nm.

Figure 19:
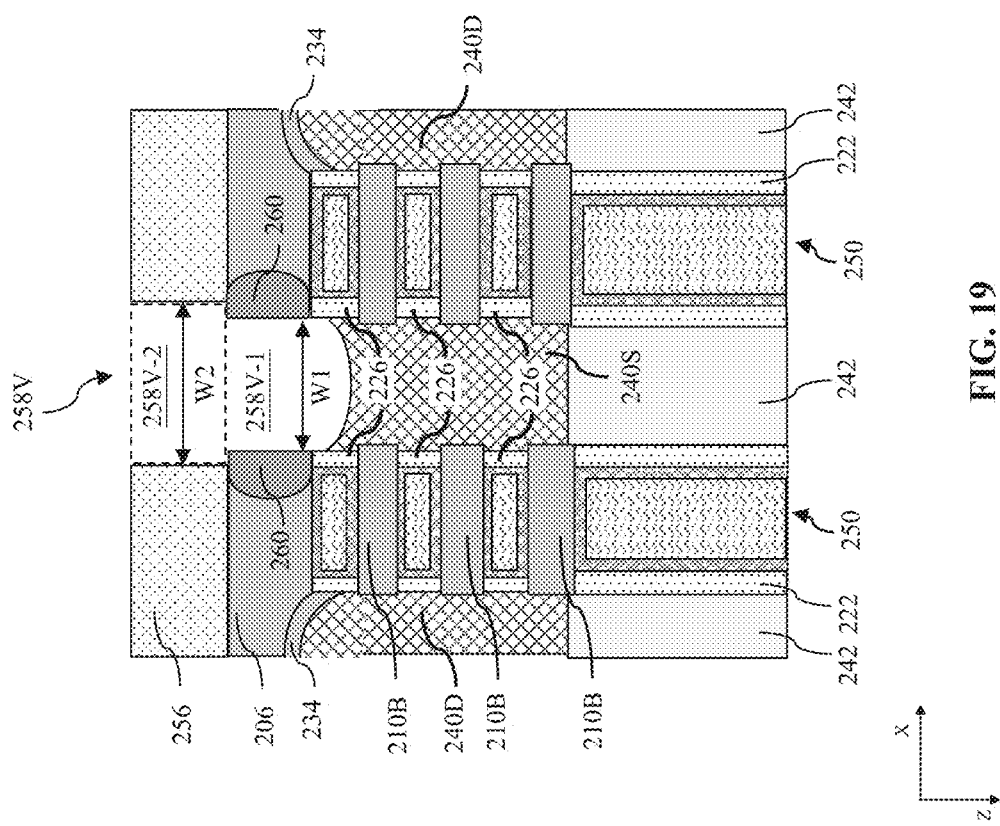
Figure 20:
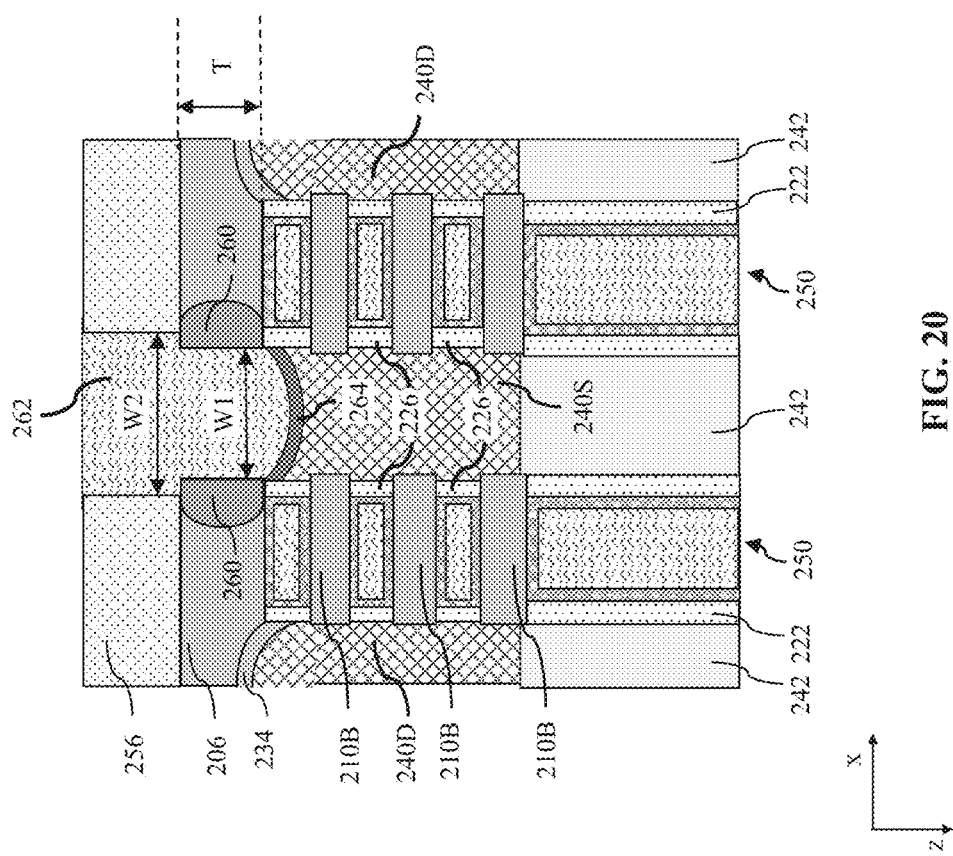
Figures 21A, 21B:
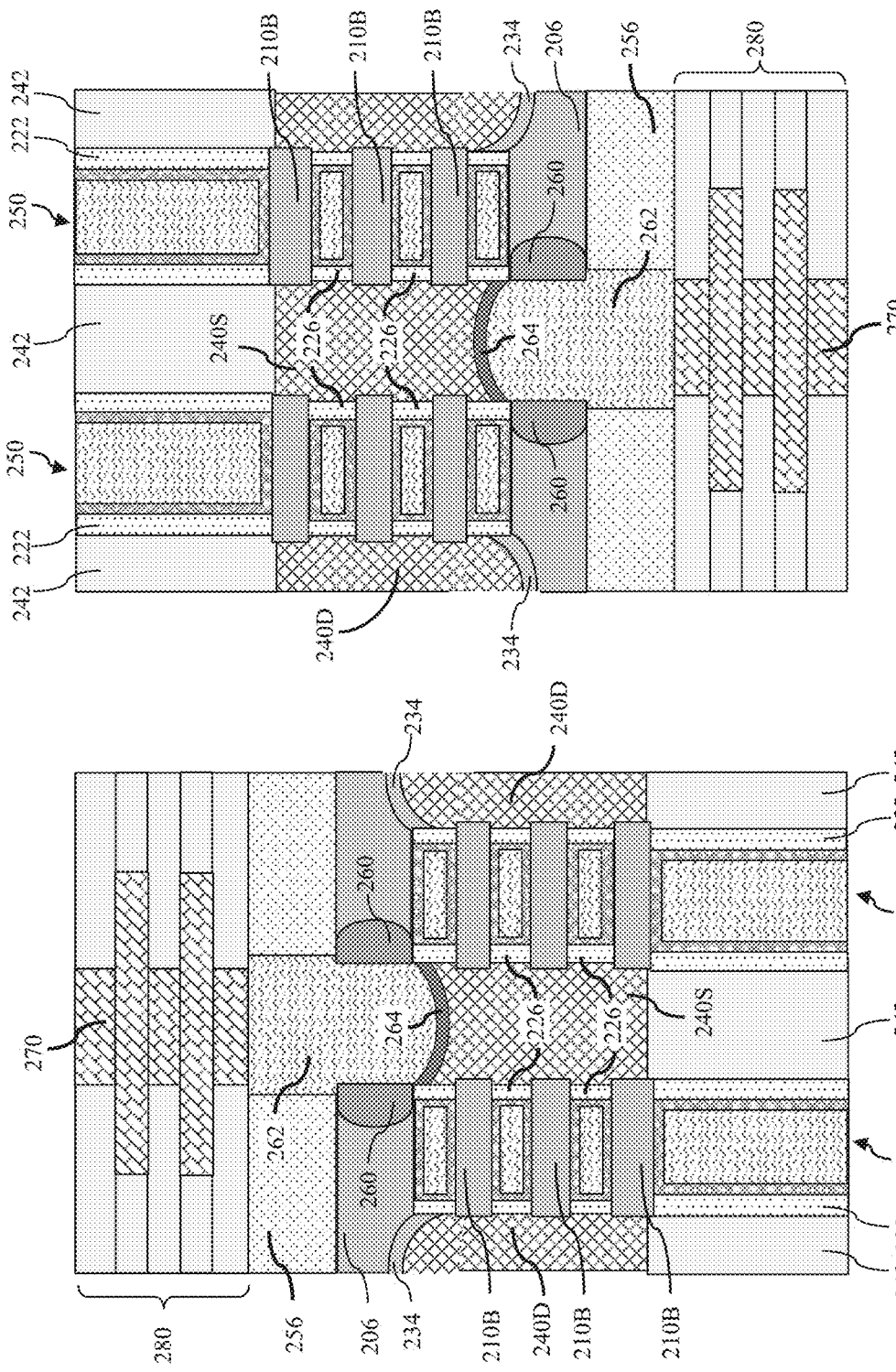

Now referring to FIGS. 1, 19, and 20, at operation 155, the backside via 262 is formed in the via trench 258V. In some embodiments, before depositing the conductive material of the backside via, a pre-clean process is performed to remove the oxide over the surfaces of the via trench 258V (i.e. surface preparation). For example, the via trench 258V is cleaned using a proper chemical solution followed by a water rinse. The pre-cleaning process also laterally removes the side portions of the bottom dielectric layer 256 forming part of the sidewalls of the via trench 258V. Therefore, the via trench 258V includes a first portion 258V-1 between the backside spacers 260 and a second portion 258V-2 between the bottom dielectric layer 256. As depicted in FIG. 19, the width W2 of the second portion 258V-2 is greater than the width W1 of the first portion 258V-1. In other words, the opening of the via trench 258V is enlarged after the pre-cleaning process. In some embodiments, the width W2 is about 25% to about 45% more than the width W1.

Thereafter, the backside via 262 is formed in the via trench 258V. In some embodiments, the backside via 262 includes a conductive material such as W, Ru, Co, Cu, Mo, Ni, Ti, TiN, Ta, TaN, other conductive material, or combinations thereof. In some embodiments, the conductive material of the backside via 262 are deposited by any suitable process in the via trench 258V and over the backside surface of the bottom dielectric layer 256. A planarization process (for example, CMP) is then performed to remove the excess conductive material and expose the bottom dielectric layer 256. Thereby, the remained conductive material forms the backside via 262. Referring to FIG. 20, the backside via 262 includes a first portion between the backside spacers 260 and a second portion between the bottom dielectric layer 256, which will connect to the later formed backside power rails. The first portion of the backside via 262 has a width W1 and the second portion of the backside via 262 has a width W2, wherein W2 is greater than W1. The width W2 is controlled by the duration of the pre-clean process, such that it would not be too large or too small. If the width W2 is too large, it may break the backside isolation and cause leakage between the conductive material of the backside via 262 and the backside semiconductor layer 206. If the width W2 is too small, it cannot achieve the purpose of enlarge the size of the backside via to mitigate the overlay shifting issue and reduce the resistance. In some embodiments, the width W1 is about 70% to about 80% of the width W2. In some further embodiments, the width W2 is about 30 nm to about 50 nm, while the width W1 is about 20 nm to about 40 nm.

Still referring to FIG. 20, a silicide layer 264 may be formed between the epitaxial source feature 240S and the backside via 262 to further reduce the parasitic resistance therebetween. In some embodiments, an annealing process can be performed to form the silicide layer 264 between the vias 262 and the epitaxial source feature 240S. The heat causes the constituents of the epitaxial source feature 240S to react with the backside via 262, thus the silicide layer 264 may include the conductive material of the backside via 262 and the constituent of the epitaxial source feature 240S, for example, TiSi, CoSi, MoSi, and etc. As depicted in FIG. 20, the silicide layer 264 directly contact the sidewalls of the inner spacers 226. In some embodiments, the silicide layer 264 is considered as a portion of the backside via 262.

Now referring to FIGS. 1, 21A and 21B, at operation 160, power rail 270 and other backside interconnection structures 280 are formed on the backside of the device 200. In some embodiments, the power rail 270 includes a conductive material such as Cu, Al, Co, W, Ti, Ta, Ru, other metal material, or combinations thereof. The power rail 270 may be formed by any suitable method, such as CVD, ALD, PVD, plating, chemical oxidation, thermal oxidation, other suitable methods, or combinations thereof. And, the shape of the power rail 270 can be patterned via a photoresist and/or etching process according to the design requirements of the device 200. Therefore, the epitaxial source feature 240S can connect to the corresponding power supply (for example, Vdd) through the backside via 262 and the power rail 270. FIG. 21B is merely an upside-down view of FIG. 21A, where the device 200 in a normal X-Z plane (i.e. the frontside is up, and the backside is down).

Compare with a conventional semiconductor device with a dielectric protection layer formed along the sidewalls of the backside via, the semiconductor device in the present disclosure using backside spacers to realize the isolate between the conductive material and the semiconductor material. The backside spacers are thicker than the conventional dielectric protection layer, thus can provide better isolation between source and source or between source and gate. The backside via size is enlarged without the protection dielectric layer and the portion connecting to the power rail is further enlarged by a pre-clean process. Therefore, the overlay shifting issue when forming the backside power rail can be mitigated and the routing resistance can be reduced. In addition, the size of the silicide layer 264 is also enlarged since no dielectric protection layer formed along the side. Thereby, the resistance can be further reduced.

Although not intended to be limiting, one or more embodiments of the present disclosure provide many benefits to an integrated circuit and a formation process thereof. For example, embodiments of the present disclosure provide a semiconductor device including backside spacers formed between the backside via and the bottom semiconductor layer. The backside via includes a first portion between the backside spacers and a second portion with a greater width between the bottom dielectric layer. The silicide layer between the backside via and the epitaxial source feature directly contacts the inner spacers. The backside via and the silicide layer have larger sizes compare with a conventional structure, thus the overlay shifting issue during the power rail formation can be mitigated and the resistance can be reduced. Therefore, the performance and the reliability of the semiconductor device can be improved.

The present disclosure provides for many different embodiments. Semiconductor device having backside spacer and methods of fabrication thereof are disclosed herein. An exemplary semiconductor device comprises a dielectric layer formed over a power rail; a bottom semiconductor layer formed over the dielectric layer; a backside spacer formed along a sidewall of the bottom semiconductor layer; a conductive feature contacting a sidewall of the dielectric layer and a sidewall of the backside spacer; channel semiconductor layers over the bottom semiconductor layer, wherein the channel semiconductor layers are stacked up and separated from each other; a metal gate structure wrapping each of the channel semiconductor layers; and an epitaxial source/drain (S/D) feature contacting a sidewall of each of the channel semiconductor layers, wherein the epitaxial S/D feature contacts the conductive feature, and the conductive feature contacts the power rail.

In some embodiments, a bottom surface of the backside spacer contacts a top surface of the dielectric layer.

In some embodiments, the exemplary semiconductor device further comprises an inner spacer formed along a sidewall of the metal gate structure, wherein a top surface of the backside spacer contacts a bottom surface of the inner spacer. In some further embodiments, the conductive feature includes a silicide layer contacting a bottom surface of the epitaxial S/D feature, and the silicide layer laterally contacts the inner spacer.

In some embodiments, a first portion of the conductive feature contacts the sidewall of the backside spacer and a second portion of the conductive feature contacts the sidewall of the dielectric layer, and a width of the first portion is less than a width of the second portion. In some further embodiments, a bottom surface of the backside spacer contacts a top surface of the second portion of the conductive feature. In some further embodiments, the width of the first portion of the conductive feature is about 70% to about 80% of the width of the second portion. In some further embodiments, a depth of the backside spacer is about 20% to about 25% of a width of the first portion of the conductive feature. In some further embodiments, a height of the backside spacer is about 60% to about 80% of a width of the first portion of the conductive feature.

Another exemplary semiconductor device comprises a dielectric layer formed over a power rail; a bottom semiconductor layer formed over the dielectric layer; a conductive feature protruding through the dielectric layer and the bottom semiconductor layer, wherein a lower portion of the conductive feature contacts sidewalls of the dielectric layer; a spacer formed between an upper portion of the conductive feature and sidewalls of the bottom semiconductor layer; an epitaxial source feature formed over a source region of the semiconductor device and contacting a top surface of the conductive feature; and an epitaxial drain feature formed over a drain region of the semiconductor device and contacting a top surface of the bottom semiconductor layer.

In some embodiments, a distance between the sidewalls of the bottom semiconductor layer is greater than a distance between the sidewalls of the dielectric layer. In some embodiments, a bottom surface of the spacer contacts top surfaces of the dielectric layer and the lower portion of the conductive feature. In some embodiments, a top surface of the conductive feature is above a top surface of the bottom semiconductor layer.

A method of forming a semiconductor device comprises epitaxially growing a scarification layer over a substrate; epitaxially growing a bottom semiconductor layer over the sacrificial layer, wherein a material of the bottom semiconductor layer is different from a material of the sacrificial layer; forming a semiconductor stack over the bottom semiconductor layer, wherein the semiconductor stack includes first semiconductor layers and second semiconductor layers alternately stacked up over the bottom semiconductor layer, a material of the first semiconductor layers is different from a material of the second semiconductor layers; forming dummy gate structures over the semiconductor stack; forming a source/drain (S/D) trench between the dummy gate structures, wherein a bottom surface of the S/D trench below a bottom surface of the sacrificial layer; epitaxially growing a semiconductor feature in the S/D trench, wherein the semiconductor feature includes a same material as the bottom semiconductor layer; epitaxially growing a S/D feature over the semiconductor feature in the S/D trench; removing the substrate and replacing the sacrificial layer with a dielectric layer; removing the semiconductor feature and a portion of the bottom semiconductor layer to form a backside trench, wherein the backside trench includes a main portion along sidewalls of the dielectric layer and extending to a bottom surface of the S/D feature and a side portion laterally away from the main portion and along a sidewall of the bottom semiconductor layer; forming a backside spacer in the side portion of the backside trench; and forming a conductive feature in the main portion of the backside trench.

In some embodiments, the removing the semiconductor feature and the portion of the bottom semiconductor layer to form the backside trench includes an isotropic etching process. In some embodiments, the backside spacer includes a dielectric material different from a material of the dielectric layer. In some embodiments, a width of the side portion of the backside trench is about 20% to about 25% of a width of the main portion of the backside trench.

In some embodiments, the forming the conductive feature in the main portion of the backside trench includes: pre-cleaning the backside trench to laterally remove a side portion of the dielectric layer such that an opening of the backside trench is enlarged; and forming the conductive feature in the backside trench. In some further embodiments, the opening of the backside trench is enlarged for about 25% to about 45%. In some further embodiments, the method further comprises forming inner spacers between side portions of the first semiconductor layers; removing the dummy gate structures and the second semiconductor layers to form gate trenches; forming metal gate structures in the gate trenches; and forming a silicide layer between the conductive feature and the S/D feature, wherein the silicide layer laterally contacts the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   epitaxially growing a sacrificial layer over a substrate;
   epitaxially growing a bottom semiconductor layer over the sacrificial layer;
   forming a semiconductor stack over the bottom semiconductor layer, wherein the semiconductor stack includes first semiconductor layers and second semiconductor layers interleaving the first semiconductor layers;
   forming dummy gate structures over the semiconductor stack;
   forming a source/drain (S/D) trench between two adjacent dummy gate structures of the dummy gate structures, wherein the S/D trench extends partially into the substrate;
   epitaxially growing a semiconductor feature in the S/D trench,
   epitaxially growing a S/D feature over the semiconductor feature in the S/D trench;
   removing the substrate and replacing the sacrificial layer with a dielectric layer;
   removing the semiconductor feature to form a backside trench, wherein the backside trench includes a main portion along sidewalls of the dielectric layer and extending to a bottom surface of the S/D feature and a side portion laterally away from the main portion and along a sidewall of the bottom semiconductor layer;
   forming a backside spacer in the side portion of the backside trench; and
   forming a conductive feature in the main portion of the backside trench.

2. The method of claim 1, wherein a composition of the bottom semiconductor layer is different from a composition of the sacrificial layer.

3. The method of claim 2,
   wherein the bottom semiconductor layer comprises silicon,
   wherein the sacrificial layer comprises silicon germanium.

4. The method of claim 1, wherein the removing the semiconductor feature an isotropic etching process.

5. The method of claim 1, wherein the backside spacer includes a dielectric material different from a material of the dielectric layer.

6. The method of claim 1, wherein a width of the side portion of the backside trench is about 20% to about 25% of a width of the main portion of the backside trench.

7. The method of claim 1, wherein the forming the conductive feature in the main portion of the backside trench includes:
   pre-cleaning the backside trench to laterally remove a side portion of the dielectric layer such that an opening of the backside trench is enlarged; and
   forming the conductive feature in the backside trench.

8. The method of claim 7, wherein the opening of the backside trench is enlarged for about 25% to about 45%.

9. The method of claim 7, further comprising:
   forming inner spacers between side portions of the first semiconductor layers;
   removing the dummy gate structures and the second semiconductor layers to form gate trenches;
   forming metal gate structures in the gate trenches; and
   forming a silicide layer between the conductive feature and the S/D feature, wherein the silicide layer laterally contacts the inner spacers.

10. A method, comprising:
    epitaxially growing a silicon germanium layer over a substrate;
    epitaxially growing a bottom silicon layer over the silicon germanium layer;
    forming a semiconductor stack over the bottom silicon layer, wherein the semiconductor stack includes first semiconductor layers interleaved by second semiconductor layers;
    patterning the semiconductor stack to form a fin-shaped structure;
    forming a first dummy gate structure and a second dummy gate structure over the fin-shaped structure;
    forming a source/drain (S/D) trench between the first dummy gate structure and the second dummy gate structure, wherein the S/D trench extends partially into the substrate;
    forming a plurality of inner spacer features to interleave the first semiconductor layers
    depositing a semiconductor feature in the S/D trench;
    epitaxially growing a S/D feature over the semiconductor feature in the S/D trench;
    removing the substrate;
    replacing the silicon germanium layer with a bottom dielectric layer;
    removing the semiconductor feature to expose the S/D feature in a backside trench, wherein the backside trench extends laterally to undercut a bottommost inner spacer feature of the plurality of inner spacer features;
    forming a backside spacer below the bottommost inner spacer feature and adjacent the bottom silicon layer; and
    forming a conductive feature in the backside trench.

11. The method of claim 10, wherein the substrate comprises a first silicon layer, a second silicon layer disposed over the first silicon layer, and a silicon oxide layer sandwiched between the first silicon layer and the second silicon layer.

12. The method of claim 10, further comprising:
    before the epitaxially growing of the S/D feature, depositing an undoped silicon layer on the semiconductor feature.

13. The method of claim 10, wherein the removing of the semiconductor feature comprises:
    performing an anisotropic selective etch; and
    performing an isotropic selective etch.

14. The method of claim 13, wherein the isotropic selective etch comprises use of potassium hydroxide (KOH), tetramethylammonium hydroxide (TMAH), other alkaline solution, or a combination thereof.

15. The method of claim 13, wherein the isotropic selective etch comprises ammonium hydroxide ($NH_4OH$).

16. The method of claim 15, wherein the isotropic selective etch comprises a temperature between about 50° C. and about 70° C.

17. The method of claim 10, further comprising:
    before the removing of the substrate, removing the first dummy gate structure and the second dummy gate structure;
    selectively removing the second semiconductor layers to release the first semiconductor layers as channel semiconductor layers; and
    forming a gate structure to wrap around each of the channel semiconductor layers.

18. A method, comprising:
    receiving a workpiece comprising:
    a substrate,
    a sacrificial layer over the substrate, a bottom semiconductor layer over the sacrificial layer,
a first stack of channel nanostructures and a second stack of channel nanostructures over the bottom semiconductor layer,
a first plurality of inner spacer features interleaving the first stack of channel nanostructures,
a second plurality of inner spacer features interleaving the second stack of channel nanostructures,
a source/drain (S/D) feature extending between the first stack of channel nanostructures and the second stack of channel nanostructures, and
a semiconductor feature disposed below the S/D feature and extending through the bottom semiconductor layer and the sacrificial layer;
removing the substrate to expose the sacrificial layer and the semiconductor feature;
replacing the sacrificial layer with a bottom dielectric layer;
removing the semiconductor feature to expose the S/D feature in a backside trench, wherein the backside trench includes a main portion along sidewalls of the bottom dielectric layer and extending to a bottom surface of the S/D feature and a side portion laterally away from the main portion and along a sidewall of the bottom semiconductor layer;
forming a backside spacer in the side portion of the backside trench; and
forming a conductive feature in the main portion of the backside trench.

19. The method of claim 18, wherein the workpiece further an undoped silicon layer sandwiched between the semiconductor feature and the S/D feature.

20. The method of claim 18, wherein the semiconductor feature comprises:
performing an anisotropic selective etch; and
performing a selective dry etching using ammonium hydroxide (NH4OH) at a temperature of about 50° C. to about 70° C.

* * * * *